(12) United States Patent
Brodzeli et al.

(10) Patent No.: US 9,921,248 B2
(45) Date of Patent: Mar. 20, 2018

(54) OPTICALLY BASED VOLTAGE SENSING DEVICE AND METHOD

(71) Applicant: NewSouth Innovations Pty Ltd, Sydney (AU)

(72) Inventors: Zourab Brodzeli, Maroubra (AU); Leonardo Silvestri, Coogee (AU); Andrew Mark Michie, Dee Why (AU); Vladimir Chigrinov, Sai Kung (HK); Eugene Pozhidaev, Moscow (RU); Francois Ladouceur, Waterloo (AU)

(73) Assignee: ZEDELEF PTY LTD, Waterloo, NSW (AU)

( * ) Notice: Subject to any disclaimer, the term of this patent is extended or adjusted under 35 U.S.C. 154(b) by 530 days.

(21) Appl. No.: 14/370,031

(22) PCT Filed: Jan. 25, 2013

(86) PCT No.: PCT/AU2013/000069
§ 371 (c)(1),
(2) Date: Jun. 30, 2014

(87) PCT Pub. No.: WO2013/110141
PCT Pub. Date: Aug. 1, 2013

(65) Prior Publication Data
US 2014/0354263 A1    Dec. 4, 2014

(30) Foreign Application Priority Data

Jan. 25, 2012 (AU) ................................ 2012900296

(51) Int. Cl.
*G01R 15/24* (2006.01)
*G01H 11/08* (2006.01)
(Continued)

(52) U.S. Cl.
CPC ............. *G01R 15/24* (2013.01); *G01H 11/08* (2013.01); *G01R 1/071* (2013.01); *G01R 15/241* (2013.01);
(Continued)

(58) Field of Classification Search
CPC .... G01R 15/24; G01R 15/241; G01R 15/247; G01R 15/142; G01R 15/144;
(Continued)

(56) References Cited

U.S. PATENT DOCUMENTS 4,329,580 A * 5/1982 Riley ................. G01R 29/0892
250/215
4,376,247 A * 3/1983 Humphrey ....... G01R 19/16571
250/227.21
(Continued)

FOREIGN PATENT DOCUMENTS

CN 101408558 4/2009
EP 0272871 B1 3/1993
(Continued)

OTHER PUBLICATIONS

Kawamura, M. et al, "Multi-Sensing System by Using Liquid Crystal Cells and a Corner Cube Prism", 12th International Conference on Optical Fibre Sensors, Oct. 28-31, 1997, Williamsburg, VA, USA. Technical Digest. Postconference Edition. 1997. pp. 290-293 (paper OWC37).
(Continued)

Primary Examiner — Gordon J Stock, Jr.
(74) Attorney, Agent, or Firm — Ladas & Parry, LLP

(57) ABSTRACT

A method of measuring fluctuations in electric fields is disclosed, the method comprising the step of: placing a Liquid Crystal Device in communication with the electric field, the device having disparate orthogonal polarization sensitivity to an external electric field; utilizing an optical
(Continued)

probe beam having a known polarization state to interrogate the liquid crystal of the liquid crystal device to produce a response beam; and analyzing the polarization state of the response beam to provide an indicator of the corresponding fluctuations in the electric field.

19 Claims, 21 Drawing Sheets

(51) Int. Cl.
  G01R 1/07      (2006.01)
  G01R 29/12     (2006.01)
  G01H 9/00      (2006.01)
(52) U.S. Cl.
  CPC ......... *G01R 15/242* (2013.01); *G01R 15/247* (2013.01); *G01R 29/12* (2013.01); *G01H 9/002* (2013.01); *G01H 9/004* (2013.01)
(58) Field of Classification Search
  CPC .. G01R 15/242; G01R 15/243; G01R 15/245; G01R 15/246; G01R 1/071; G01R 29/12; G01R 29/08; G01R 29/0878; G01R 29/0885; G01R 29/14; G01R 19/0084; G01R 19/145; G01R 19/155; G01R 1/06; G01R 1/067; G01R 1/07; G01R 19/00; G01R 19/0092; G01R 19/15; G01H 9/00; G01H 9/002; G01H 9/004; G01H 11/00; G01H 11/06; G01H 11/08; G01V 8/00; G01V 8/10; G01V 8/12; G01V 8/14; G01V 8/16; G01V 8/20; G01V 8/22; G01V 8/24
  See application file for complete search history.

(56)  References Cited

U.S. PATENT DOCUMENTS

| | | | |
|---|---|---|---|
| 4,628,493 A | | 12/1986 | Nelson et al. |
| 4,786,858 A | * | 11/1988 | Haas ...................... G01R 29/12 324/754.21 |
| 5,335,210 A | | 8/1994 | Bernstein |
| 5,381,253 A | | 1/1995 | Sharp et al. |
| 5,699,461 A | | 12/1997 | Minemoto |
| 5,796,504 A | | 8/1998 | Sonderegger et al. |
| 7,223,962 B2 | | 5/2007 | Fageraas et al. |
| 7,474,404 B2 | | 1/2009 | VanWiggeren |
| 2004/0047535 A1 | * | 3/2004 | Ukrainczyk ....... G01N 21/7703 385/12 |
| 2004/0051870 A1 | * | 3/2004 | Sandberg .................. G01J 1/04 356/338 |
| 2010/0118007 A1 | * | 5/2010 | Hori ...................... G09G 3/3614 345/207 |
| 2011/0285928 A1 | * | 11/2011 | Chigrinov ............. G02F 1/1416 349/33 |

FOREIGN PATENT DOCUMENTS

| | | | |
|---|---|---|---|
| GB | 2117993 A | | 10/1983 |
| JP | 08086815 A | * | 4/1996 |

OTHER PUBLICATIONS

Brodzeli, Z. et al, "Electrical Energy Harvesting Device for Current/Voltage Fibre-Based Sensors", in 35th Australian Conference on Optical Fibre Technology (ACOFT), Dec. 5-9, 2010, pp. 1-2.
Brodzeli, Z. et al, "Liquid Crystal-Based Hydrophone Arrays", Photonic Sensors, 2012, vol. 2, No. 3, pp. 237-246.
Brodzeli, Z. et al, "Voltage sensor based on Deformed Helix Ferroelectric Liquid Crystal", Third Asia Pacific Optical Sensors Conference, Jan. 31-Feb. 3, 2012, Sydney, Australia, SPIE Proceedings, Jan. 5, 2012, vol. 8351, paper 83512L.
Brodzeli, Z. et al, "Distributed hydrophone array based on liquid crystal cell", Third Asia Pacific Optical Sensors Conference, Jan. 31-Feb. 3, 2012, Sydney, Australia, SPIE Proceedings, Jan. 5, 2012, vol. 8351, paper 83512C.
Silvestri, L. et al, "Reflection from gold-coated deformed-helix ferroelectric liquid crystal cells: theory and experiment", Third Asia Pacific Optical Sensors Conference, Jan. 31-3.
ISR dated Apr. 10, 2013 for related PCT/AU2013/000069.
IPRP completed on May 12, 2014 for related PCT/AU2013/000069.
Beresnev, L. A., Chigrinov, V. G., Dergachev, D. I., Poshidaev, E. P., FünfschillingJ. & Schadt M. "Deformed helix ferroelectric liquid crystal display: A new electrooptic mode in ferroelectric chiral smectic liquid crystals", Liquid Crystals, 5:4, 1171-1177 (1989).
Chigrinov, V.G., Baikalov, V.A., Pozhidaev, E.P., Blinov, L.M., Beresnev, L.A., Allagulov, A.A., "Flexoelectric polarization of ferroelectric smectic liquid crystal", Sov. phys. JETP, vol. 88, 2015-2024 (1985).
Kiselev, A.D., Pozhidaev,E.P., Chigrinov,V.G., Hoi-Sing Kwok, "Polarization-gratings approach to deformed-helix ferroelectric liquid crystals with subwavelength pitch", Phys. Rev. E., vol. 83 (3), 031703 (2011).
Laming, R.I., Payne, D.N., "Electric current sensors employing spun highly birefringent optical fibers", Journal of Lightwave Technology, 5, 2084-2094, (1989).
Ostrovskii, B.I.; Chigrinov, V.G., "Linear electrooptic effect in chiral smectic C liquid crystals" Kristallografiya, vol. 25 (3), 560-567 (1980).
Sanders, G. A., Blake, J. N., Rose, A. H., Rahmatian, F., Herdman C.,"Commercialization of fiber-optic current and voltage sensors at NxtPhase", OFS-15, Proc. 31-34, (2002).
Zhang, B., Li,K., Chigrinov,V., Kwok,H.S., Huang,H.C., "Application of Photoalignment Technology to Liquid-Crystal-on-Silicon Microdisplays," Jpn. J. Appl. Phys., vol. 44, (6A), 3983-3991, (2005).
Alexei D. Kiselev, Eugene P. Pozhidaev, Vladimir G. Chigrinov, and Hoi-Sing Kwok. "Polarization Gratings and Electro-Optics of Deformed Helix Ferroelectric Liquid Crystals"; Photonics Letters of Poland, vol. 3(1), 29-31 (2011); accepted Feb. 18, 2011; published Mar. 31, 2011.
H K Bal, F Sidiroglou, S F Collins and Z Brodzeli. "Multiplexing of Fibre Optic Reflective Sensors Using Bragg Gratings". Measurement Science and Technology vol. 21 No. 9 (2010).
Leung, et al. "A Distributed-Feedback Fiber-Laser-Based Optical Fiber Hydrophone System With Very High Sensitivity." Proc. SPIE 5634, 434 (2005);; Conference Date: Monday Nov. 8, 2004; Conference Location: Beijing, China; Conference Title: Advanced Sensor Systems and Applications II.
Spillman & Soref. "Hybrid fiber-optic sensors using liquid-crystal light modulators and piezoceramic transducers". Applied Optics, V21, No. 15, pp. 2696-2702 (1982).
V.G. Chigrinov, H.S. Kwok, A. Poon, A. Bermak. "Recent Liquid Crystal Photonics Research in Hkust"; Photonics Letters of Poland, vol. 3 (1), 2-4 (2011). Hong Kong University of Science and Technology, CWB, Kowloon, Hong Kong; accepted Mar. 21, 2011; published Mar. 31, 2011.
Office Action dated Feb. 19, 2016 for Australian Patent Application No. 2013212538.
Office Action dated Dec. 25, 2015 for Chinese Patent Application No. 201380006485.9 and its English translation provided by Applicant's foreign counsel.
Extended European Search Report dated Jan. 8, 2016 for European Patent Application No. 13741115.3.
Written Opinion of the International Searching Authority for PCT/AU2013/000069 dated Apr. 10, 2013.
Cohen G B et al, "Spatial Light Modulator Based on a Deformed-Helix Ferroelectric Liquid Crystal and a Thin A-SI:H Amorphous Photoconductor", Applied Optics, Optical Society of America, Washington, DC; US, (Jan. 10, 1997), vol. 36, No. 2, doi:10.1364/AO.36.000455, ISSN 0003-6935, p. 455-459.

(56) References Cited

OTHER PUBLICATIONS

Office action from Chinese Patent Application No. 201380006485.9 dated Jul. 15, 2016, and its English translation.

* cited by examiner

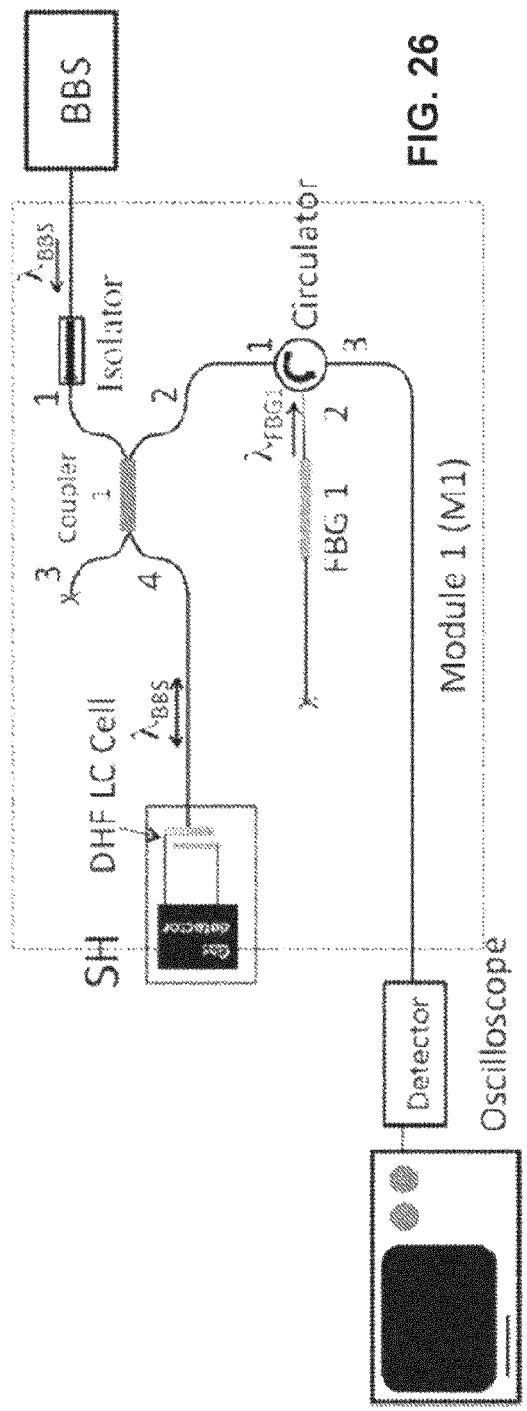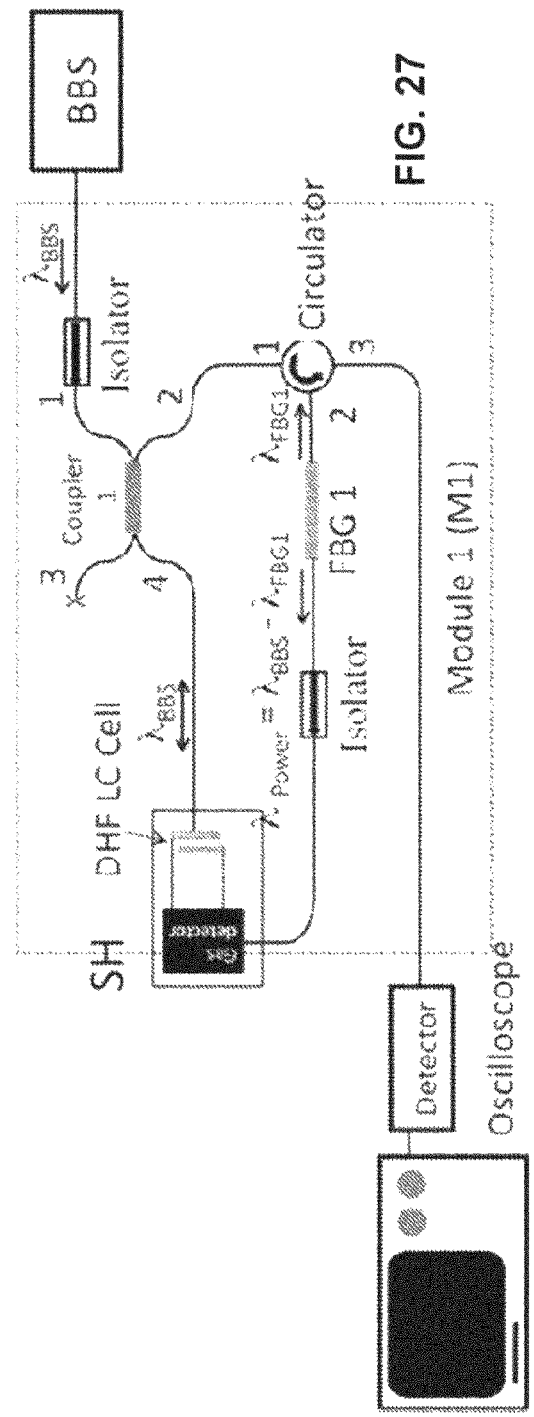
FIG. 26
FIG. 27

OPTICALLY BASED VOLTAGE SENSING DEVICE AND METHOD

CROSS-REFERENCE TO RELATED APPLICATIONS

This application is the U.S. National Stage of International Patent Application No. PCT/AU2013/000069 filed on Jan. 25, 2013, which claims priority to Australian Patent Application No. 2012900296 filed on Jan. 25, 2012.

FIELD OF THE INVENTION

The present invention relates to the field of electro-optical transducers converting an electrically sensed signal into an optical signal, in particular, discloses an optical voltage detector utilizing the controlled refractive index response of a liquid crystal material to sense changes in an electric field.

REFERENCES

Sanders, G. A., Blake, J. N., Rose, A. H., Rahmatian, F., Herdman C., "Commercialization of fiber-optic current and voltage sensors at NxtPhase", *OFS*-15, Proc. 31-34, (2002).
Laming, R. I., Payne, D. N., "Electric current sensors employing spun highly birefringent optical fibers", Journal of Lightwave Technology, 5, 2084-2094, (1989).
Beresnev, L. A., Chigrinov, V. G., Dergachev, D. I., Poshidaev, E. P., Fünfschilling J. & Schadt M. "Deformed helix ferroelectric liquid crystal display: A new electrooptic mode in ferroelectric chiral smectic liquid crystals", Liquid Crystals, 5:4, 1171-1177 (1989).
Ostrovskii, B. I.; Chigrinov, V. G., "Linear electrooptic effect in chiral smectic C liquid crystals" Kristallografiya, vol. 25 (3), 560-567 (1980).
Chigrinov, V. G., Baikalov, V. A., Pozhidaev, E. P., Blinov, L. M., Beresnev, L. A., Allagulov, A. A., "Flexoelectric polarization of ferroelectric smectic liquid crystal", Soy. phys. JETP, Vol. 88, 2015-2024 (1985).
Kiselev, A. D., Pozhidaev, E. P., Chigrinov, V. G., Hoi-Sing Kwok, "Polarization-gratings approach to deformed-helix ferroelectric liquid crystals with subwavelength pitch", Phys. Rev. E., vol. 83 (3), 031703 (2011).
Brodzeli, Z.; Bal, H. K.; Chigrinov, V.; Murauski, A.; Ladouceur, F. "Electrical energy harvesting device for current/voltage fibre-based sensors", Optical Fibre Technology (ACOFT), 2010 35th Australian Conference on Fibre Technology, 1-2, (2010).
Zhang, B., Li, K., Chigrinov, V., Kwok, H. S., Huang, H. C., "Application of Photoalignment Technology to Liquid-Crystal-on-Silicon Microdisplays," Jpn. J. Appl. Phys., vol. 44, (6A), 3983-3991, (2005).

BACKGROUND

Any discussion of the background art throughout the specification should in no way be considered as an admission that such art is widely known or forms part of common general knowledge in the field.

The need for accurate sensing is an important resource in modern society. Sensing of changes in electric field strengths and analogues thereto is a significant undertaking.

For example, one of the most important aspects of the large scale electricity power distribution cycle is the ability to measure the quantity and quality of the energy for each point of interest. There is therefore a high importance to provide a low cost and high-accuracy voltage measurement technique for high power distribution systems.

Today's current and voltage sensing technology, such as those described in the aforementioned reference to Sanders et al., are based on a complex, large and expensive electrical approach.

A number of fibre optic based current and voltage sensors, for example, those due to Laming et al, have been proposed but have had limited commercial success due to complexity and high cost.

It would be desirable to provide for direct electric field measurement of fields up to say 400 kV/m electric fields at multiple (distributed) points.

Sensing is also important in other environments. In particular pressure sensing in water (hydrophones and sonars), monitoring of flow of gases and fluids (such as water or oil related products) in pipelines, monitoring of corrosion and detection of the presence of particular gases in atmosphere are highly relevant.

SUMMARY OF THE INVENTION

It is an object of the present invention to provide an improved optically based voltage sensing device or electro-optic transducer.

In accordance with a first aspect of the present invention, there is provided a method of measuring fluctuations in electric fields, the method comprising the step of: placing a liquid crystal device in communication with the electric field, said device having its birefringence and the direction of its optical axes sensitive to an external electric field; utilizing an optical probe beam having a known polarization state to interrogate the liquid crystal of the liquid crystal device to produce a response beam; and analyzing the polarization state of the response beam to provide an indicator of the corresponding fluctuations in the electric field.

The Liquid Crystal Device can be optically probed in a reflection mode. The Liquid Crystal Device preferably utilizes a Deformed Helix Ferroelectric Liquid Crystal (DHF-LC) liquid crystal material. The Liquid Crystal Device can be interconnected to an antenna device via electrodes for magnification of the electric field experienced by the Liquid Crystal Device. The optical probe beam can be fed via a single mode fiber to the Liquid Crystal Device.

In accordance with a further aspect of the present invention, there is provided a voltage sensor comprising: an optical input probe for inputting an optical probe beam having a predetermined polarization state; a liquid crystal device in communication with an electric field and having an internal material having its birefringence and the direction of its optical axes sensitive to an external electric field, the device being connected to the optical input probe for the transmission of the optical probe beam through the internal material to produce an optical output beam having an altered polarization state; an optical output probe for sensing the output beam; and a polarization state sensing device for sensing the altered polarization state of the output beam and to thereby determine a correlation with the state of the electric field.

In some embodiments, the internal material can comprise Deformed Helix Ferroelectric Liquid Crystal (DHF-LC). The liquid crystal device can be operated in a reflection mode with the optical input probe also forming the optical output probe. The device can also include an antenna device connected to the liquid crystal device for magnification of the electric field experienced by the internal material.

In accordance with a further aspect of the present invention, there is provided an electro-optical transducer converting an electrical signal into an optical signal, the transducer comprising: an optical input probe for inputting an optical probe beam having a predetermined polarization state; a pair of electrodes connected to a fluctuating external voltage and generating a fluctuating electric field; a liquid crystal device in communication with the fluctuating electric field and having an internal material having its birefringence and the direction of its optical axes sensitive to an external electric field, the device being connected to the optical input probe for the transmission of the optical probe beam through the internal material to produce an optical output beam having an altered polarization state; an optical output probe for sensing the output beam; and a polarization state sensing device for sensing the altered polarization state of the output beam and to thereby determine a correlation with the state of the external voltage.

The internal material can comprise Deformed Helix Ferroelectric Liquid Crystal (DHF-LC). The liquid crystal device can be operated in a reflection mode with the optical input probe also forming the optical output probe. The device can also include an amplifier device connected to the liquid crystal device for magnification of the electric field experienced by the internal material.

In accordance with a further aspect of the present invention, there is provided a method of measuring voltage fluctuations, the method comprising the step of: placing a liquid crystal device in communication with a fluctuating voltage, said device having its birefringence and the direction of its optical axes sensitive to the fluctuating voltage via electrodes; utilising an optical probe beam having a known polarization state to interrogate the liquid crystal of the liquid crystal device to produce a response beam; and analyzing the polarization state of the response beam to provide an indicator of the corresponding fluctuations in the electric field.

In accordance with a further aspect of the present invention, there is provided an optical sensing system including: a broadband optical input source; a broadband optical input source; a series of voltage sensor/optical transducer converting an electrical signal into an optical signal, being interconnected to the broadband input source, each voltage sensor/optical transducer converting an electrical signal into an optical signal mapping the optical input source to a predefined polarisation state source and transmitting the predefined polarisation state source through an internal material having its birefringence and direction of its optical axes sensitive to an external electric field, thereby producing a sensor output beam having an altered polarization state; a series of polarisation state sensing devices for sensing the altered polarisation states of the sensor output beams; a series of optical filtering elements for filtering a predetermined wavelength range of said sensor output beams to produce a series of optical output channels; a de-multiplexing element for separating each optical output channel coming from the series of voltage sensor/optical transducer converting an electrical signal into an optical signal; and a series of photo-detectors for measuring the optical output channels and determining the corresponding fluctuation of the electric field.

The preferred embodiments advantageously provide for direct electric field measurement of fields up to say 400 kV/m electric fields at multiple (distributed) points. The sensing approach can be polarization independent and can exhibit linear electro-optic (EO) response to variation of the electrical field sensed.

The preferred embodiments advantageously provides for transferring electrical information obtained from various sensors such as piezo-electric elements and any other sensor elements having variation of electrical potentials as an output into the optical domain. This approach could be used in sonars/hydrophones as well as flow measurement of gases and liquids. The sensing approach can be polarization independent and can exhibit linear electro-optic (EO) response to variation of the electrical field sensed.

BRIEF DESCRIPTION OF THE DRAWINGS

Preferred embodiments of the invention will now be described, by way of example only, with reference to the accompanying drawings in which:

FIG. 26 illustrates a first schematic gas detector embodiment where the gas detector is passive and directly connected to the LC transducer;

FIG. 27 illustrates a second schematic of a gas sensor which is powered optically;

DETAILED DESCRIPTION

In the preferred embodiments there is provided a fiber optic voltage sensor that utilizes a voltage-controlled Liquid Crystal (LC) to allow for direct measurement of up to 400 kV/m electric fields at multiple points, as well as electro-optic transducer allowing transfer any information from electrical into optical domain. In addition, the polarization independent fibre optic sensor/transducer configuration of the preferred embodiments exhibit an almost linear electro-optic (EO) response to variations of the electrical field under test.

Figure 1:
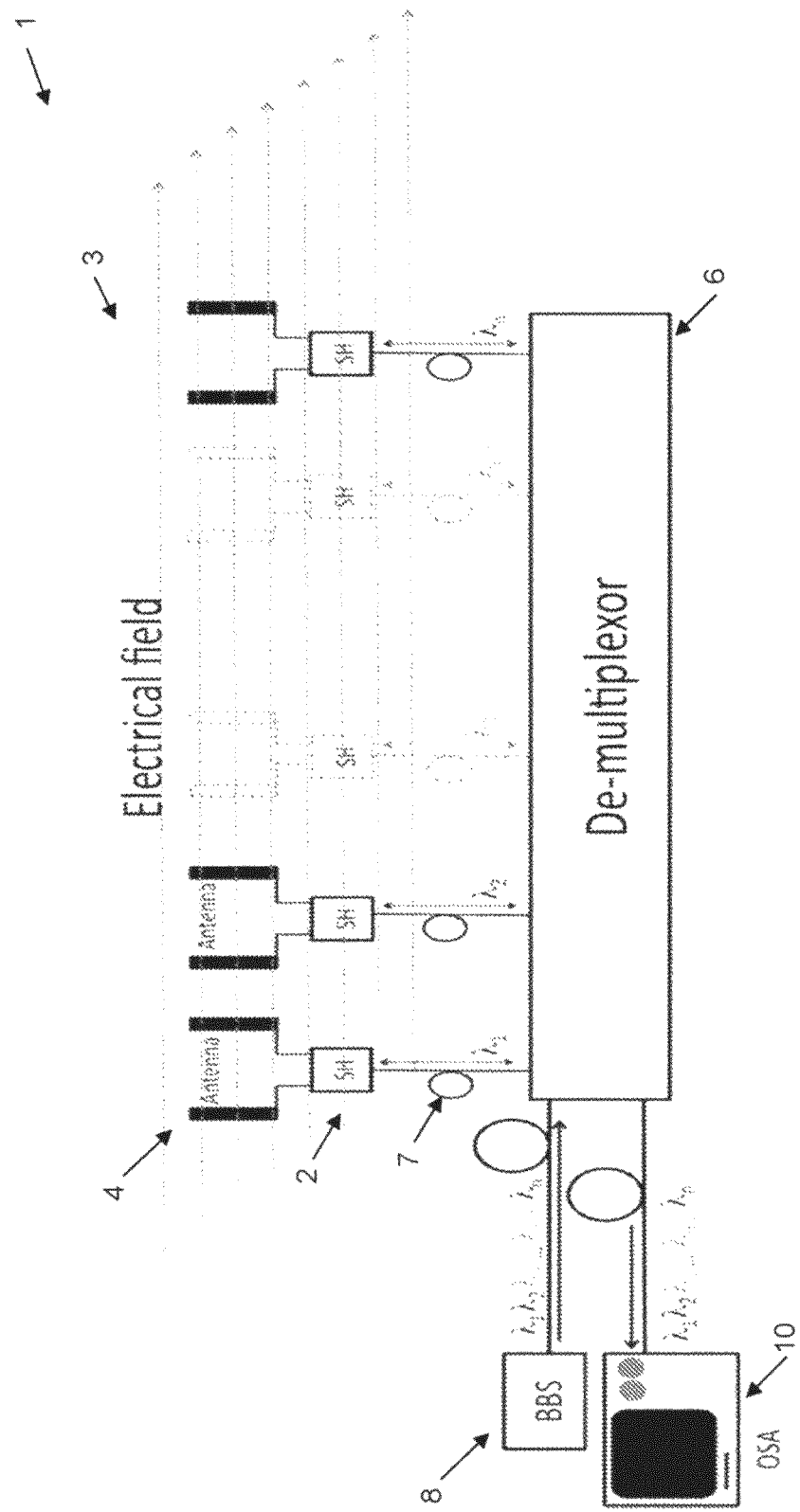
FIG. 1 illustrates schematically the electrical filed sensing system of a first embodiment.

FIG. 1 provides a schematic illustration of the proposed sensing system of the preferred embodiment 1. The sensing system includes a series of sensor heads e.g. 2 (SH) for monitoring an external electric field 3. Interconnected to the sensor head 2 is an antenna 4 for harvesting energy from the electric field under test and applying it to the sensor head (SH). Each sensor head 2 is interconnected to a de-multiplexer/multiplexer 6 by means of a single mode optical fiber cable e.g. 7, with each sensor head being sensed via a Broad Band Source but reflects separate wavelength, which is combined by multiplexer. The demultiplexer (DM), provides for a networking type device which allows for a series of measurements to be taken of electrical field levels at a number of distributed points in space utilising one sensing system. The de-multiplexer/multiplexer has as one input one broadband source (BBS) 8 and the return signals from multiple sensor heads can be output to one optical spectrum analyser (OSA) 10. The source 8 supplies a broadband unpolarised optical signal ($\lambda_1$ to $\lambda_v$) into the de-multiplexer/multiplexer 6, which supplies it the SH, gathers reflected signal off it, assigns particular wavelength to and combines it into the common line with other channels to be analysed The SH 2 reflects the channel back into the DM 6 according to the value of the electrical field surrounding the antenna. The DM 6 also gathers all the channels reflected from the SHs and directs them into the monitoring device (OSA) 10.

Figure 2:
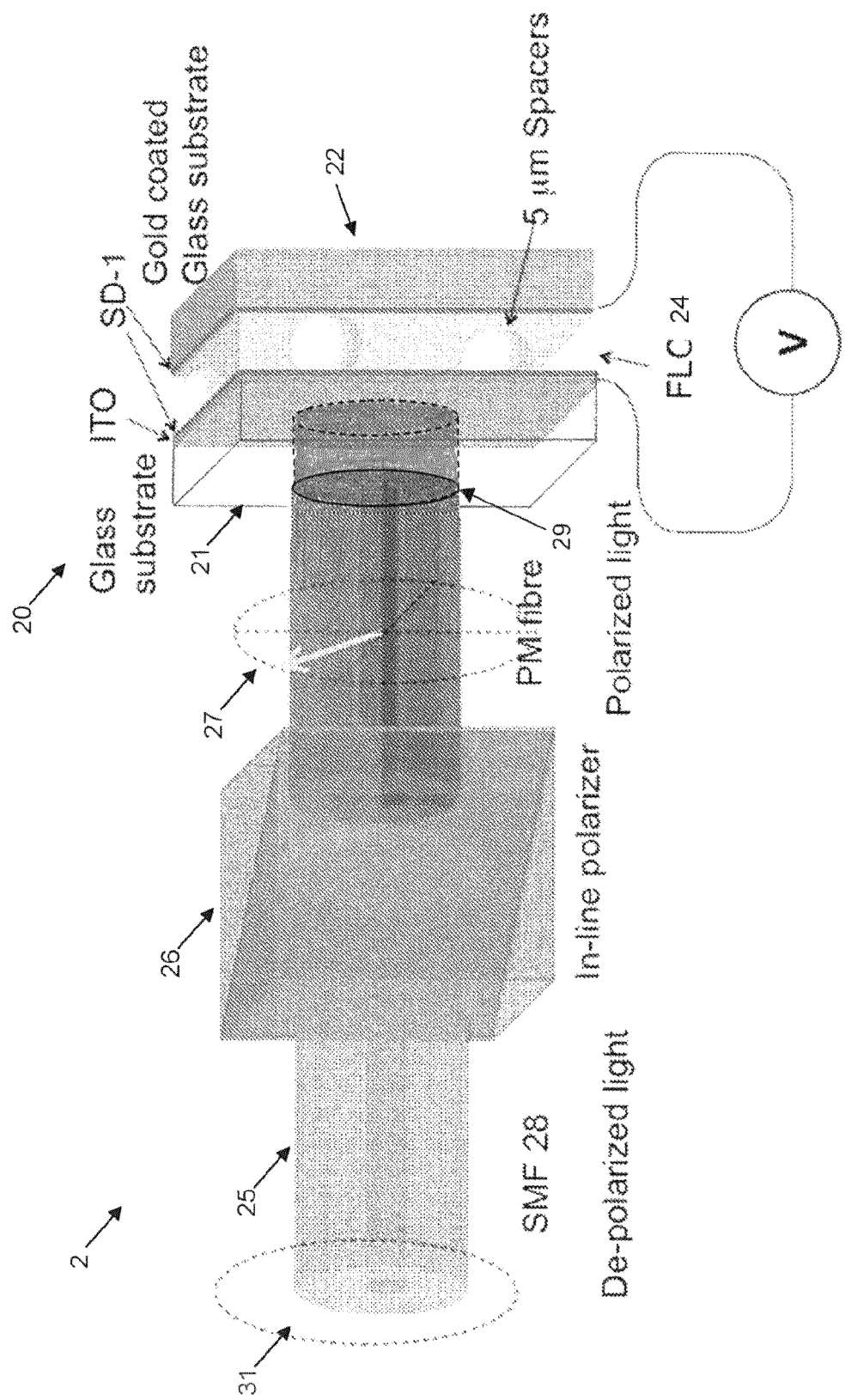
FIG. 2 illustrates schematically the fibre optic FLC cell.

Sensor Head (SH) 2:

The purpose of the sensor head is to monitor the optical properties of a liquid crystal cell (LC) placed within the electric field under test. FIG. 2 illustrates one form of sensor head 2. The SH is a hybrid device based on the fusion of fibre optics and LC technologies. The sensor head utilises the excellent wave guiding properties of fibre optics and the ability to multiplex different wavelengths together with the high electro-optic coefficients of a LC 20.

The LC cell 20 itself can consists of two sandwiched glass substrates 21, 22. The inner surface of one of the substrates 21 is coated with transparent Indium Tin Oxide (ITO). The inner surface of the other substrate 22 can be coated with gold. Both of the coatings are used as electrodes thus enabling the creation of a controlled electrical field between glass substrates. The gold coating is used as a broadband reflector allowing operation of the cell in reflection. The gap between the substrates is filled with Ferroelectric Liquid Crystal (FLC) operating in Deformed Helix Ferroelectric (DHF) mode as per the aforementioned Beresnev et al disclosure. DHF-LC mode exhibits substantially linear variation of reflectivity of the cell in crossed polarisers when placed inside an electrical field (as per the references due to Ostrovskii et al, Chigrinov, V. G. et al.). The behavior of the DHF structure in an electric field has been described in the aforementioned references, including its static and dynamic aspects.

In order to provide direct coupling, the fibre 27 can be inserted through a hole 29 drilled in the glass substrate 21 of the LC cell so the fibre is in direct physical contact with the LC material, possibly through a polarizing layer and/or an electrode and/or a photo-aligning layer. The fibre can then be glued into this position. The utilization of a drilled interconnection acts to reduce system noise.

Figure 3:
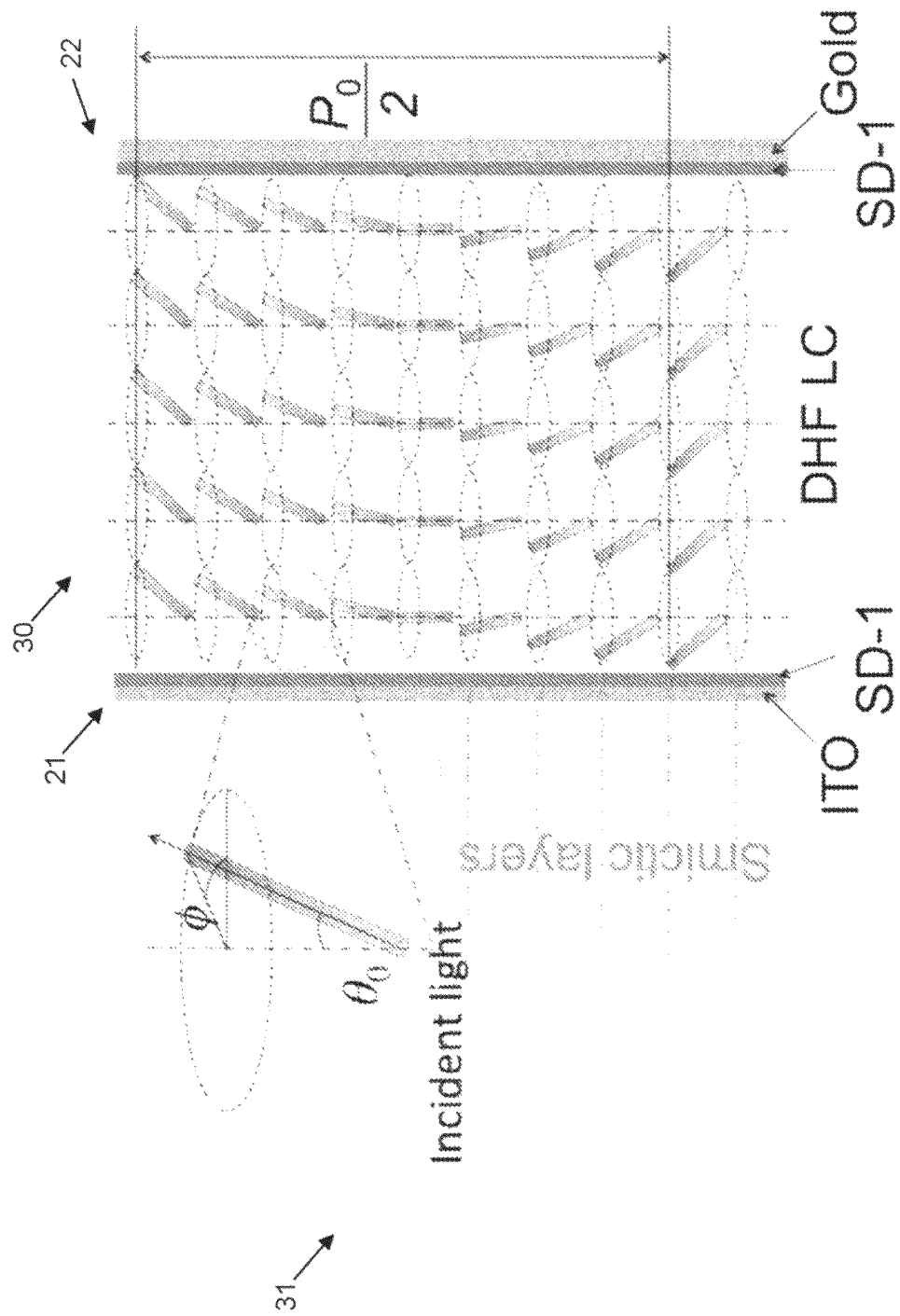
FIG. 3 illustrates schematically the operation of DHF-LC mode of a FLC cell.

Planarly aligned chiral smectic C (FLC) with its helix axis oriented parallel and its layers perpendicular to the surfaces of glass substrates define the geometry of the cell for DHF mode. Such a geometry is illustrated 30 in FIG. 3.

Returning to FIG. 2, light is delivered remotely 31 to the fibre optic sensor head by ordinary single mode lead-in fibre (SMF28) 25, an inline fibre polariser 26 polarises the light to a particular orientation, polarisation maintaining (PM) fibre 27 and a PM collimator are also provided. This ensures that correct polarisation state is delivered to the LC cell regardless of an external perturbations to the SMF28 lead-in fibre. This design also allows the SMF28 lead-in fibre to be almost arbitrarily long without significant impact on the SH performance.

Figure 25:
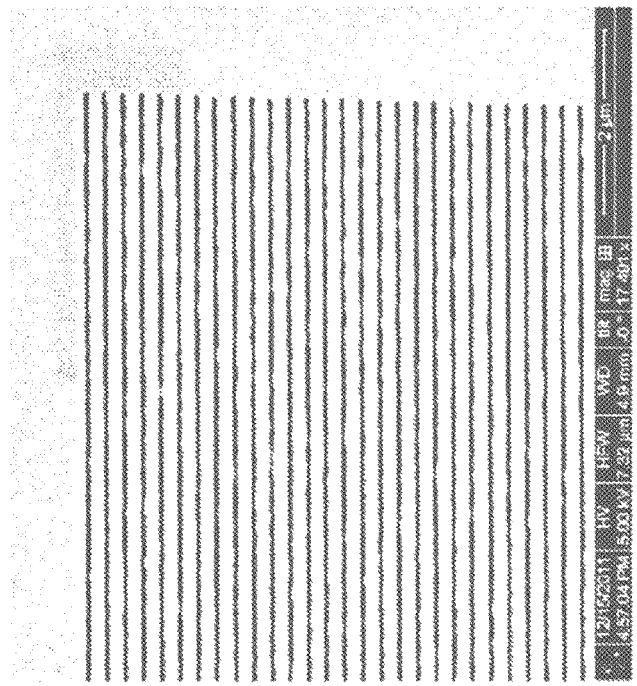
FIG. 24 and FIG. 25 are electron micrographs of a deposited polarizer suitable for use with the present invention.
Figure 24:
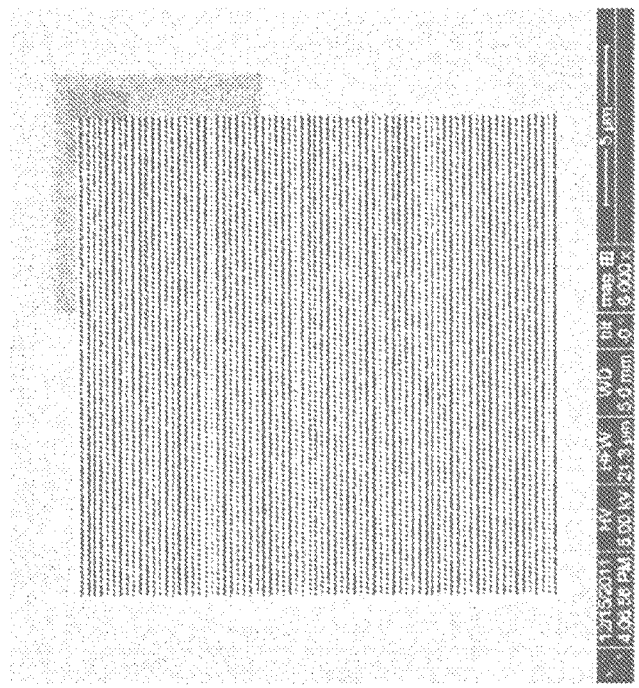

In an alternative embodiment, the polarising layer can be directly deposited on the glass substrate in the form of a Nano grid or a glass polariser. FIG. 24 and FIG. 25 illustrate E-beam microscope images of a deposited film. A Nano structure of parallel slots was etched in the golden coating deposited on the glass substrate containing optical fibre. The thickness of the gold coating is 80 nm the duty cycle 200 nm and the etched gap 60 nm. The direction of the rejected polarisation was parallel to the direction of the slots. The glass polariser is represented by polarising glass colorPol®.

Returning to FIG. 3, light 31 is normally incident on the first substrate 21 coated with ITO and is polarised at an angle β with the $S^*_C$ helix axis and passes parallel to the chiral smectic C layer through the $S^*_C$ sample, reflects off the gold coated mirror of the second substrate 22, back into the same layer of FLC and returns into PM fibre.

Far from the phase transition of the chiral smectic C, the variations of the smectic tilt angle, $\theta_\square$, in the electric field become energetically unfavorable and only the rotation angle φ around the helix axis is modulated. The corresponding dependence of the molecular distribution $\cos\varphi(2\pi z/P_0)$ (where z is the coordinate along the helix axis and $P_0$ is the helix pitch) oscillates symmetrically in +/−E electric fields. These oscillations result in a variation of the effective refractive index n of the $S^*_C$; the index ellipsoid is tilted and deformed by the electric field. Once light has been launched into the cell, the two orthogonal polarisations propagate with slightly different phase velocities resulting in a polarization state at the output that depends on the distance between the substrates and birefringence of the LC. The distance is kept constant while birefringence (the difference between ordinary and extraordinary refractive indexes) changes with the application of the external electrical field. This changing phase difference and subsequently the angle of the resulting polarisation, which is transformed in the variation of the intensity by the PM fibre and in-line polariser, is then detected by the photo-diode.

Antenna

The electric field required to switch the LC cell is around few volts (typically 5 to 10 V) per µm (5000 to 10000 kV/m) is much higher than the desired field under test (100 to 400 kV/m or 0.1 to 0.4 V/µm). Thus some field amplification is required. This amplification can be accomplished using an antenna or energy harvesting device.

Figure 4:
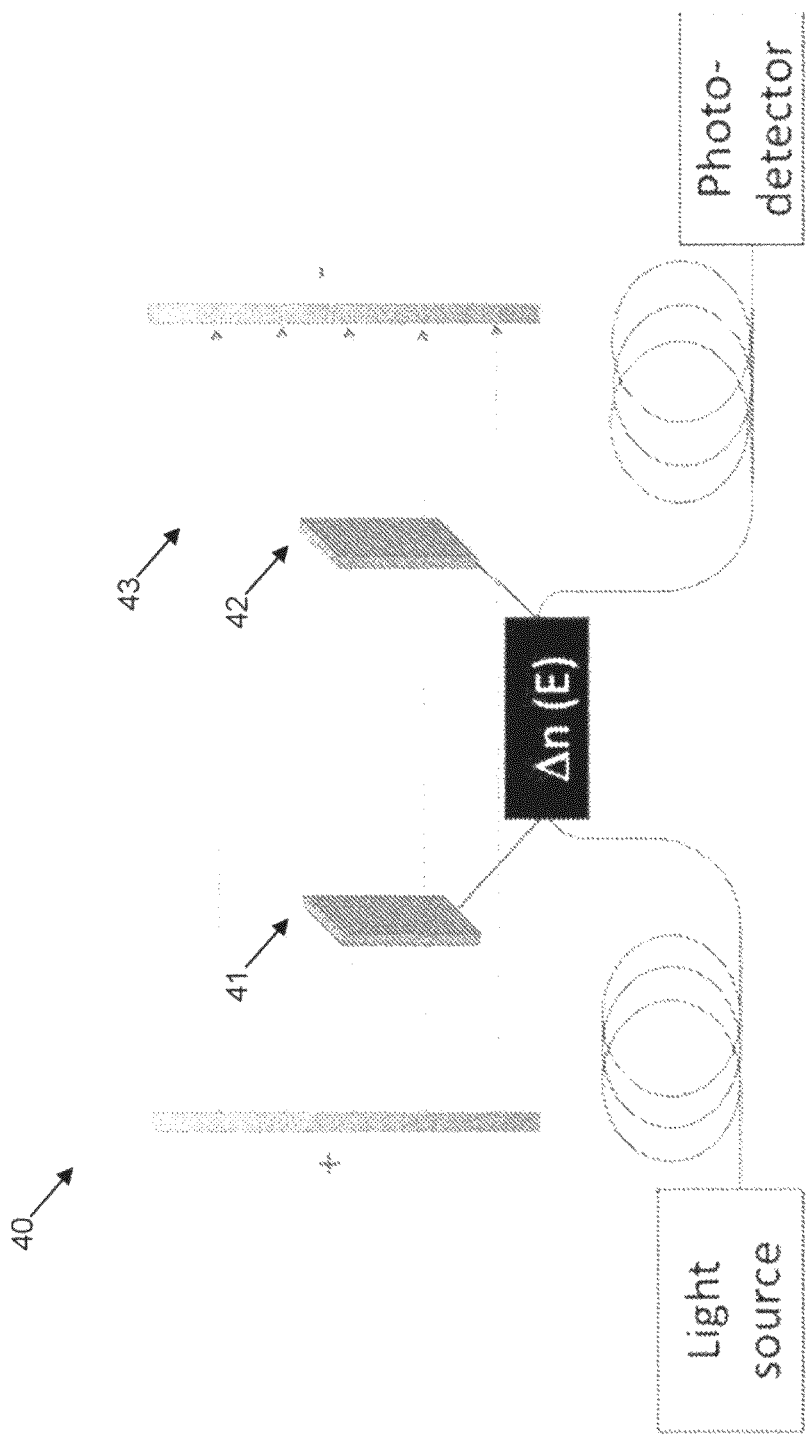
FIG. 4 illustrates the amplification via the utilisation of an antenna in an electric field.

One form of antenna is shown 40, in FIG. 4. In its simplest form, it can be constructed from two plates 41, 42 made of conductive material placed parallel to each other and perpendicular to the direction of the external electrical field 43 under test. The external field applied induces a voltage on the antenna's electrodes, which can then be used to switch the cell. The geometrical properties and energy harvesting capabilities of the antenna were estimated. In the table below are presented the various geometrical areas of the antennas required to produce 270 V when inserted into an electrical field of 300 kV/m.

| Area of antenna [mm$^2$] | Required distance [mm] |
|---|---|
| 400 × 400 mm$^2$ | 8.5 |
| 300 × 300 mm$^2$ | 14.7 |
| 200 × 200 mm$^2$ | 31.2 |

Figure 5:
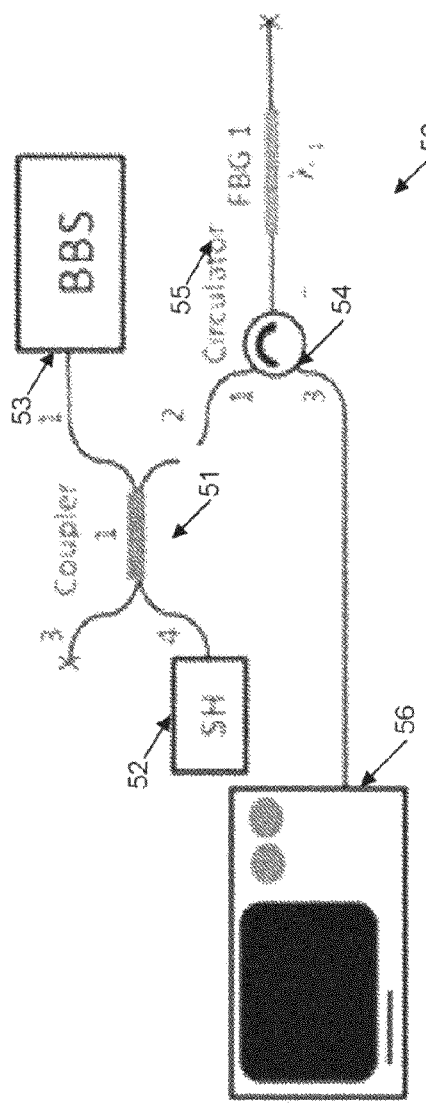
FIG. 5 illustrates a single module of an optical sensing system.

Demultiplexer (DM):

The demultiplexer DM in a prototype form was developed using a 3 dB 2×2 bi-directional coupler and circulator incorporating a fibre Bragg grating (FBG). One simple form of the prototype DM is illustrated 50 in FIG. 5. Port 4 of coupler 51 is connected to the SH 52 and port 1 to the broadband light source 53. Any change of reflectivity at the sensing end results in a variation of the signal intensity reflected back via to port 2. Port 2 of the coupler is connected to the circulator 54 via port 1, thus enabling the reflected sensing signal to reach the FBG 55 connected to port 2 of circulator. The FBG is used to selectively reflect back to port 3 of the circulator (signal detection end) that part of the broadband signal that matches the FBG's narrow spectral band ($\lambda_1$). As a result, information about the value of the electrical field or voltage can be retrieved by monitoring 56 the relative intensity of the signal reflected back from the SH to the FBG and then to the detector or OSA 56.

Figure 6:
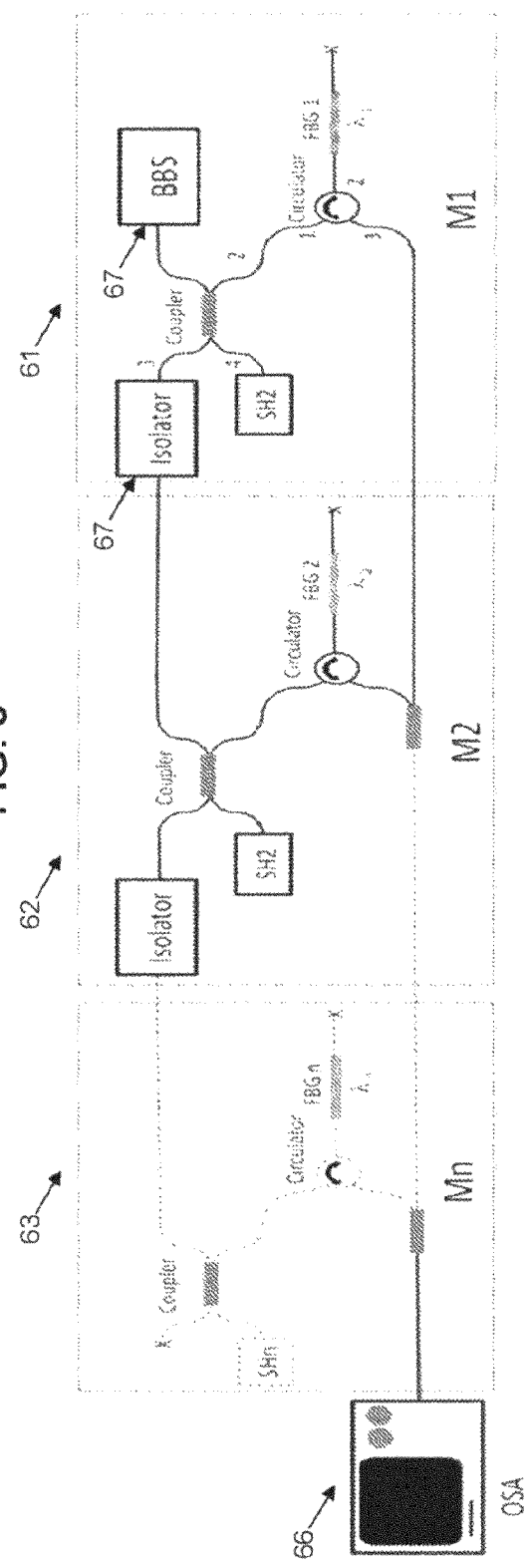
FIG. 6 illustrates multiplexing multiple module together in a sensing system.

This sensing module allows multiplexing capability by directly connecting a similar module with port 3 of coupler 1. Such an arrangement is shown in FIG. 6, with multiple sensing units 61-63 shown interconnected in a cascaded fashion to a single broadband source 67 and output monitor 66. An optical isolator e.g. 67 was used to avoid crosstalk between the modules.

Experimental Results

In order to properly characterise the preferred embodiments, two experimental set-ups were built to test the model and characterise the SH.

A theoretical model along the lines constructed by Kiselev was utilised for the bulk optic. A bulk optic version of the fibre-based setup proposed herein was constructed. The purpose of the measurements was to test the model and to adjust the parameters of DHF LC cells used.

Figure 7:
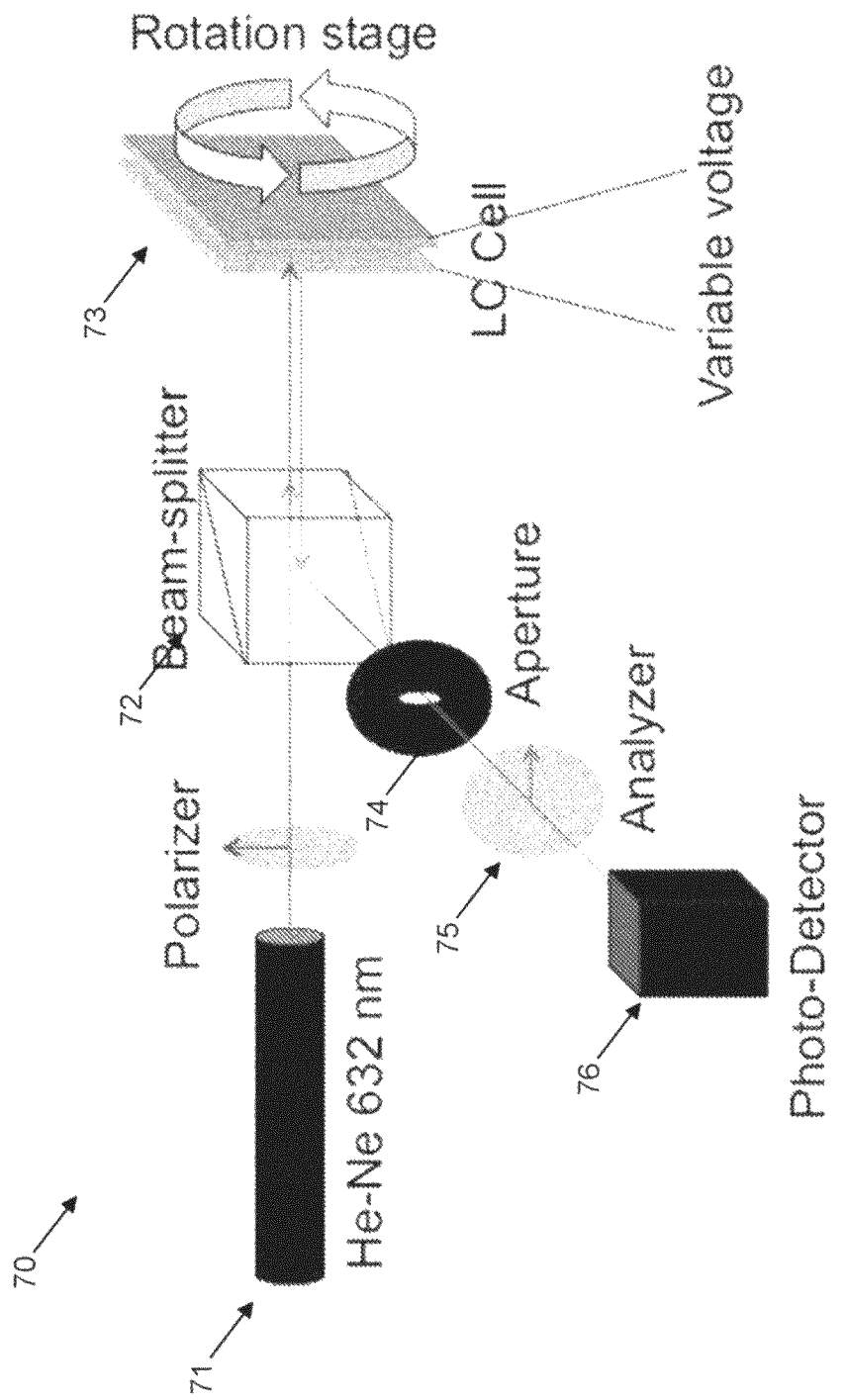
FIG. 7 illustrates a bulk optic experimental arrangement utilised to test the method of the preferred embodiment.

A schematic illustration of the arrangement was as illustrated 70 in FIG. 7. Linearly polarized light emitted by the He—Ne laser 71 at 632 nm was incident on the surface of the LC cell 73 with an incident angle of 0°. Light reflected back off the golden inner surface of the cell was transmitted through the non-polarizing beam-splitter 72, which directed 50% of light onto a photo-detector 76. An analyzer 75 was installed and aligned orthogonal to the polarization of the incident light in front of the photo-detector. An aperture 74 was used to block light scattered from the LC cell 73 and the cell 73 was placed on the rotary translation stage allowing the variation of angle between polarization of the incident light and the axis of the helix.

Figure 8:
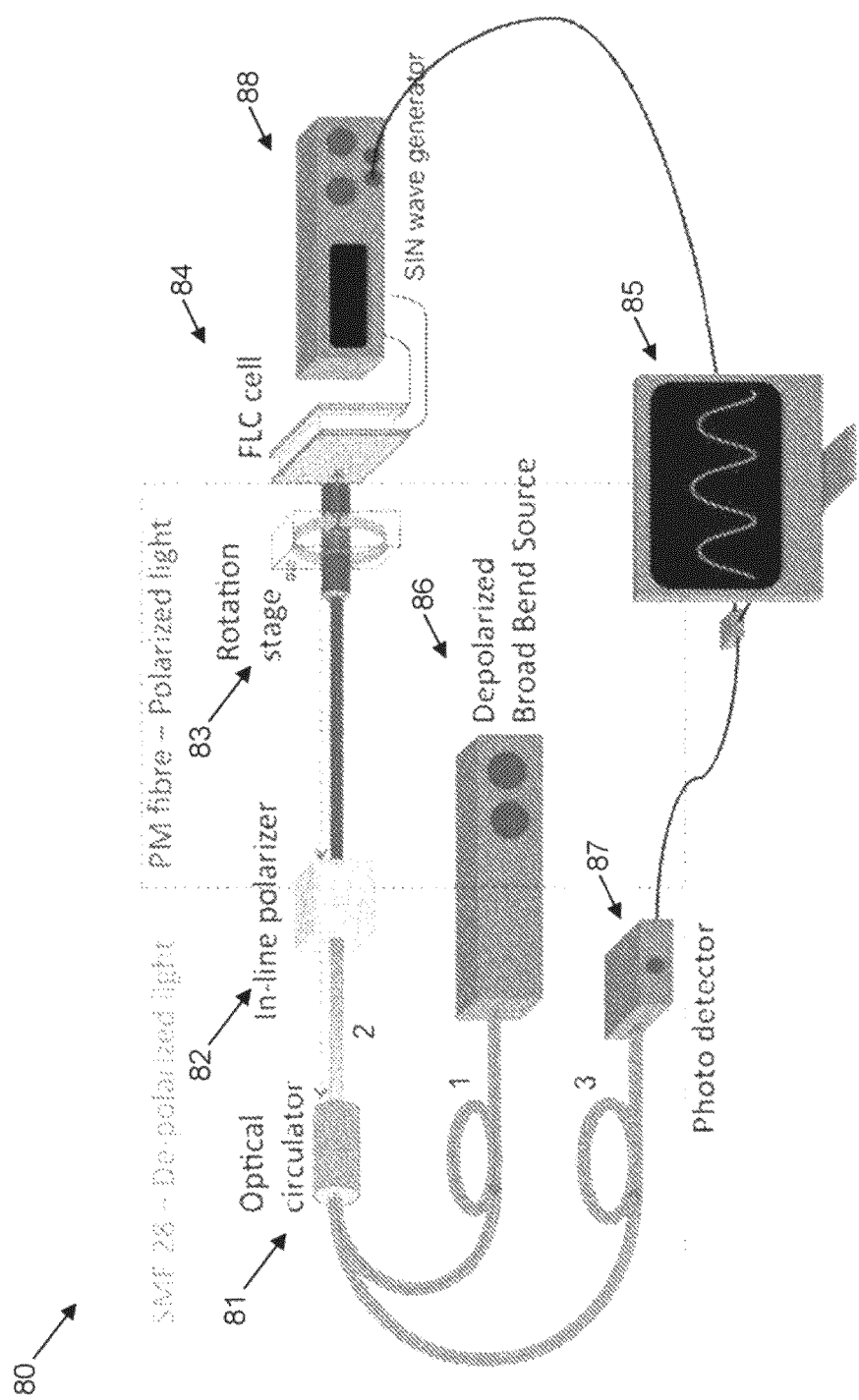
FIG. 8 illustrates an experimental prototype form of the preferred embodiment.

A prototype principle of operation of the SH for utilisation as a voltage sensor was proved using the fibre optic setup 80 shown in FIG. 8. The unpolarised broadband optical signal was emitted 86 (BBS15/16 AFC Technologies Inc.) was launched into port 1 of optical circulator 81 (6015-3Thorlabs Inc.). The circulator directed the light into port 2 which was connected to the in-line polariser 82 (CIRL), which transformed the unpolarised light into linearly polarised light. The output of the in-line polariser was forwarded via the collimated PM fibre (AFW Technology Pty. Ltd.) C-PM-15 and directly butted onto the glass substrate of the FLC cell 84 and delivered highly polarised light to the LC material. The LC cell 84 was operated in reflection and could be described as variable reflector. Our approach utilised the DHF-LC geometry, which exhibits linear variation of reflectivity with applied voltage. The angle β was adjusted by rotating a PM collimator placed inside a rotation stage 83.

The polarized light propagating through the birefringent material (LC) split into two components propagating at different speeds along the ordinary and extraordinary optical axes. At the output of the LC the two components interfere, resulting in rotated polarization and changing intensity. The PM fibre and in-line polarizer 82 at the output of the cell transformed this output light into a corresponding variation of intensity. The optical circulator 81 directed the optical signal from the LC cell into port 3, which is connected to a variable gain photo-detector 87 used to monitor 85 the variation of intensity of the light reflected as a function of voltage. The signal generator 88 by Stanford Research Systems Inc (DS340) was used to generate a variable voltage applied to LC cell. The voltage used a sinusoidal form with frequency of 50 Hz. The signal generator and photo-detector were computer controlled allowing the logging of the cell's response to the driving voltage.

Figures 10, 11:
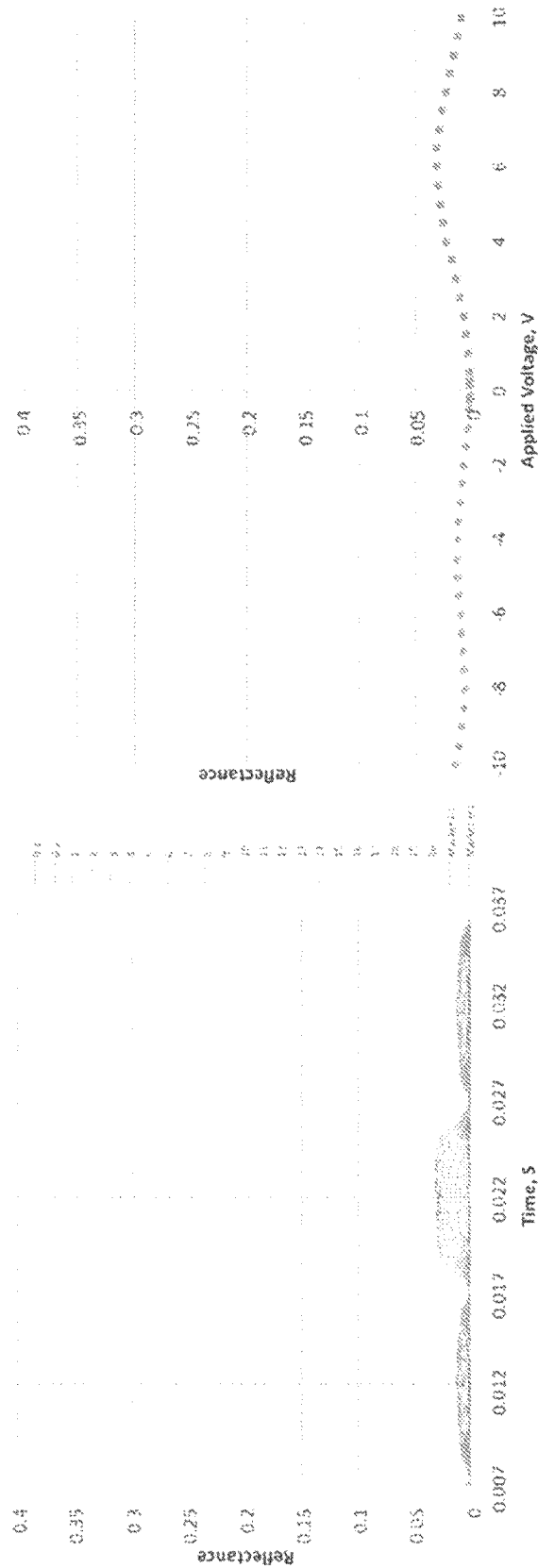
FIG. 10 illustrates the Dynamic response of an example LC cell vs varying voltage for a frequency of 50 Hz, when the direction of polarization of incident light was aligned with the helix axis ($\beta=0°$)
FIG. 11 illustrates the static response of the cell at MAX and MIN values of the variable voltage.

The LC cell 84 consisted of two sandwiched glass substrates with the gap of 5 µm in bulk arrangement of FIG. 7 and 10 µm in fibre optic arrangement of FIG. 8. One of the substrates was coated with ITO and the other with gold as per the previous discussion. The gold coating was used not only as an electrode but also as a broadband reflector allowing use of the cell in reflection. The gap between the substrates was filled with the (FLC) mixture FLC-576 developed at the P. N. Lebedev Physical Institute of Russian Academy of Sciences with a helix pitch $P_0$ of 200 nm. This LC mixture was chosen due to its short helical pitch yielding low scattering of light and allowing a DHF mode of operation (as per the Beresnev, L. reference). Planar alignment of the FLC was achieved by the photo-alignment method. In this approach, both inner surfaces of the substrates were spin-coated with a photo-aligning substance—azo-benzene sulfuric dye SD-1 dried at 155° C. Polarized UV irradiation (6 mW/cm² at 365 nm) of the azo-dye films at normal incidence was used to induce anisotropy.

Results

Figure 9:
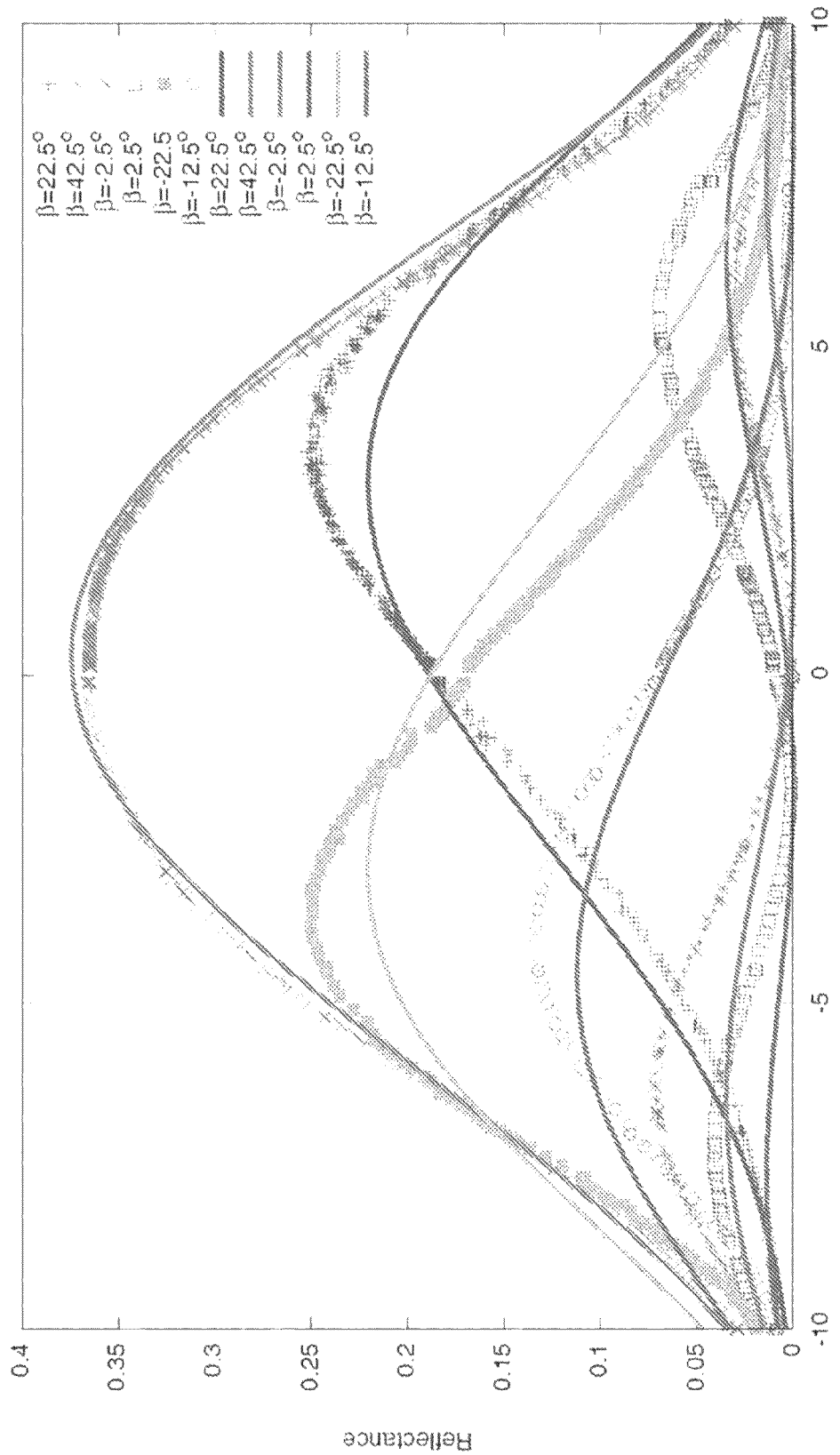
FIG. 9 illustrates the static response of a FLC cell versus applied voltage when changing polarisation angles.

FIG. 9 illustrates the static response (reflectance) of the FLC cell vs. applied voltage at crossed polarizer/analyzer, when changing angle β between direction of polarization of incident light and helix axis.

The dynamic response of LC cell for different applied voltage amplitudes (SIN wave, frequency 50 Hz) is presented in FIG. 10 when the direction of polarization of the incident light was aligned with the helix axis (β=0°). Each curve in this figure corresponds to the dynamic response (reflectance) of LC cell. The corresponding response of the cell at MAX and MIN values of variable voltage is presented in FIG. 11.

Figures 12, 13:
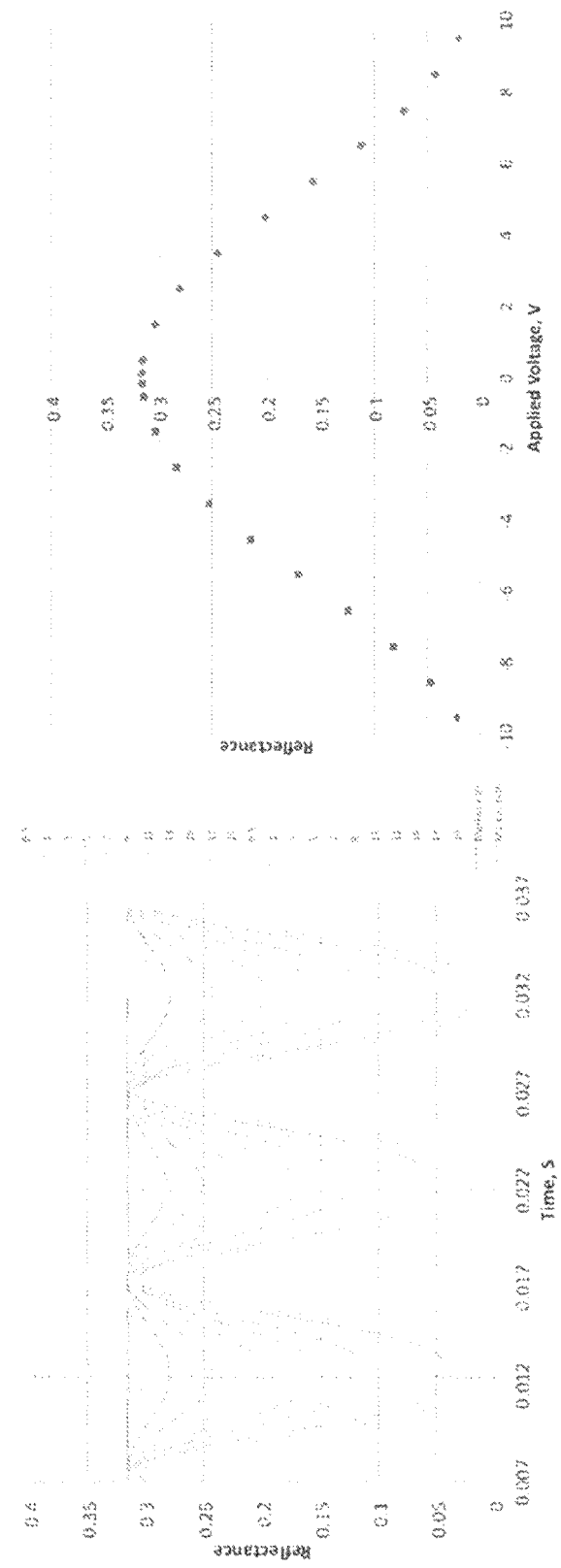
FIG. 12 and FIG. 13 illustrate the dynamic response of the LC cell when $\beta=45°$ corresponding to the maximal response.
Figures 14, 15:
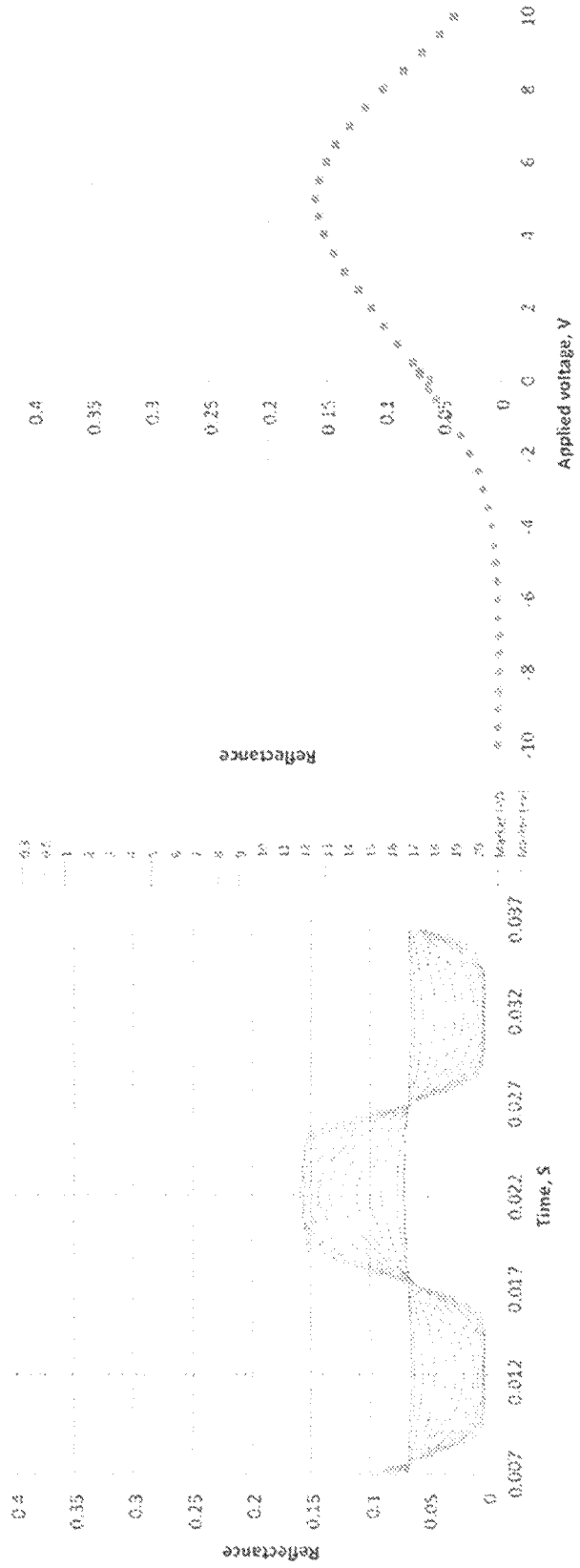
FIG. 14 and FIG. 15 illustrate the dynamic response of the LC cell when $\beta=15°$ corresponding to lowest total harmonic distortion.

Two the most important cases for sensing application are when modulation depth of the LC cell is the deepest (case when β=45°, FIG. 12, FIG. 13), or when it varies linearly with applied voltage under test (β=12.5°) FIG. 14, FIG. 15. The linear response is defined as the response with minimal total harmonic distortion (THD), meaning that the majority of the power of the output signal is concentrated in the fundamental harmonic of the cell's response. Modeling of the response of the FLC cell in DHF mode revealed that the lowest THD corresponds to β=11°, which was close to the experimentally observed value of 12.5°

Figure 17:
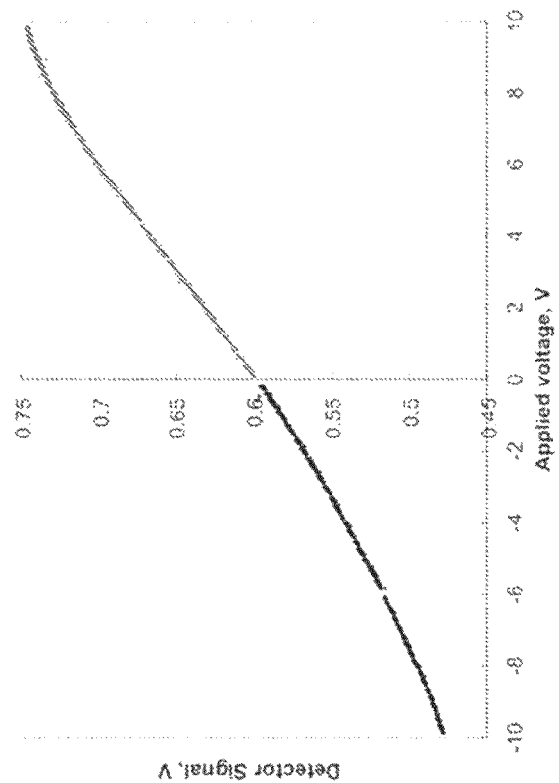
FIG. 17 illustrates the static response of the fibre based sensor head.
Figure 16:
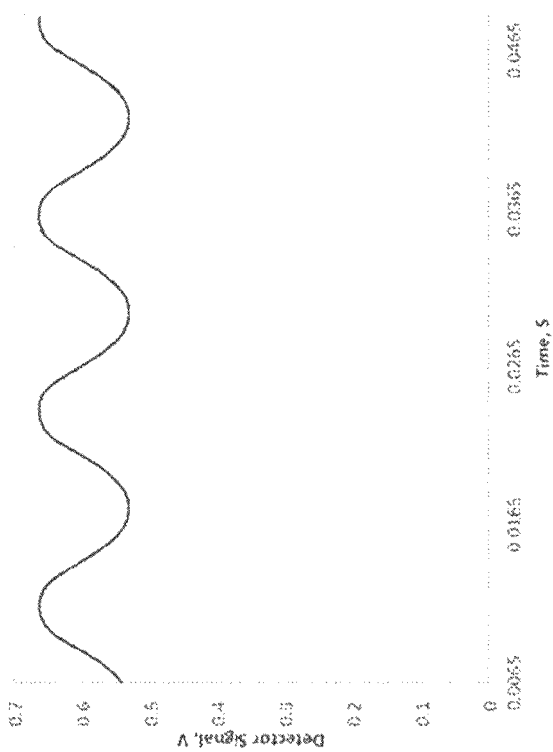
FIG. 16 illustrates the dynamic response of the fibre based sensor head.
Figures 18, 19:
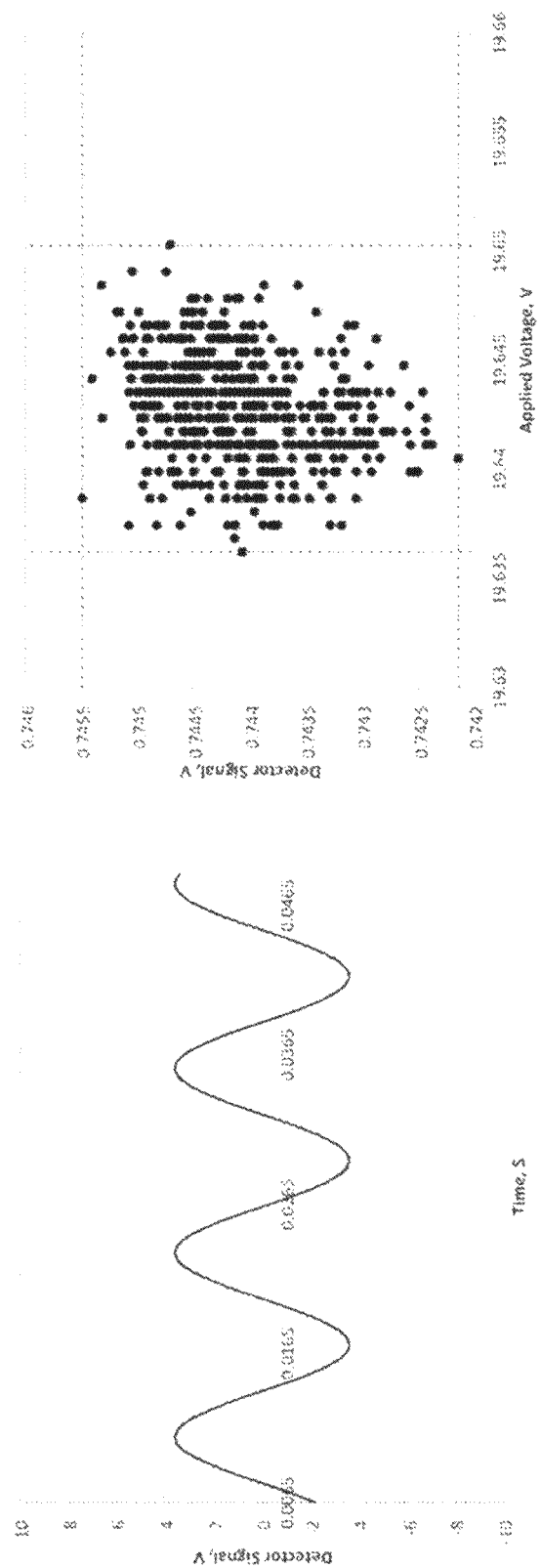
FIG. 18 and FIG. 19 illustrate the variation of the response of the SH to input voltage.

A SH based on the proposed fibre optic approach was characterized. The dynamic response of the SH to variable voltage (Sine wave at 50 Hz) and static response are presented in FIG. 16 and FIG. 17. The angle between the polarisation of incident light and axis of the helix corresponding to the most linear response of the cell was adjusted to β=12° by rotating the collimator. The stability of the device was also estimated as shown in FIG. 18 and FIG. 19. The optical signal reflected off the cell was fluctuating by 0.44% for a measured applied voltage fluctuation of ±0.03% (SIN wave, peak-to-peak amplitude of 19.6 V at frequency 50 Hz).

In review, it can therefore be seen that the preferred embodiments provide a new low cost method for the optical measurement of high electrical fields at distributed localized points. The method utilizes a Deformed Helix Ferroelectric Liquid Crystal (DHF-LC) cell as a sensor head for the optical measurement of the electrical filed. The use of ferroelectric LC in DHF mode exploits the linear electro-optic response of the LC cell to variations of the external electrical field. In addition, unique polarisation independent sensor head and system configurations are presented. The optimal parameters such as the cell's orientation and input polarisation for electric field and voltage sensing applications were experimentally measured while the performance of prototype SHs using these parameters were quantified.

The disclosed low cost, FLC cell possesses a large linear electro-optic response and is polarisation independent. The arrangement can be readily multiplexed and can be interrogated remotely via ordinary single mode SMF28 optical fibre.

It can therefore be seen that there is provided a method and system for accurately measuring the electric field at multiple sensing points. The system utilizes a sensing head of a Deformed Helix Ferroelectric Liquid Crystal (DHF-LC); The DHF-LC material has the substantial advantage that is exhibits a linear variation of reflectivity of the LC in crossed polarisers when placed inside a (not too large) electric field, with the linear response achieved by selection of a particular angle between the angle of polarisation of the incident light and the helix axis of the DHF-LC.

The system also allows for a depolarised (unpolarised) light source to be utilised enabling inexpensive ordinary single-mode lead-in fibre to be used for the lengthiest parts of the array of multiplexed sensors; this is achieved as follows: Light is delivered to the sensing head via the ordinary lead-in optical fibre, then into an in-line fibre polariser, then a polarisation-maintaining fibre, then (optionally) a polarisation maintaining (PM) collimator, and then into the sensing head.

Further, the system also allows for the thickness of the liquid crystal to be tuned to produce a maximum response.

The present invention can be further extended to other environments where a variable voltage differential is produced across the liquid crystal device. Whilst the preferred embodiment utilizes an antenna arrangement to achieve this effect, other forms of voltage inducement are envisaged. For example, a piezo-electric sensor could be attached across the liquid crystal device, or a series of microphone sensors. The extension of the present invention to a hydrophone environment will now be described.

Hydrophone Arrangement

Figure 20:
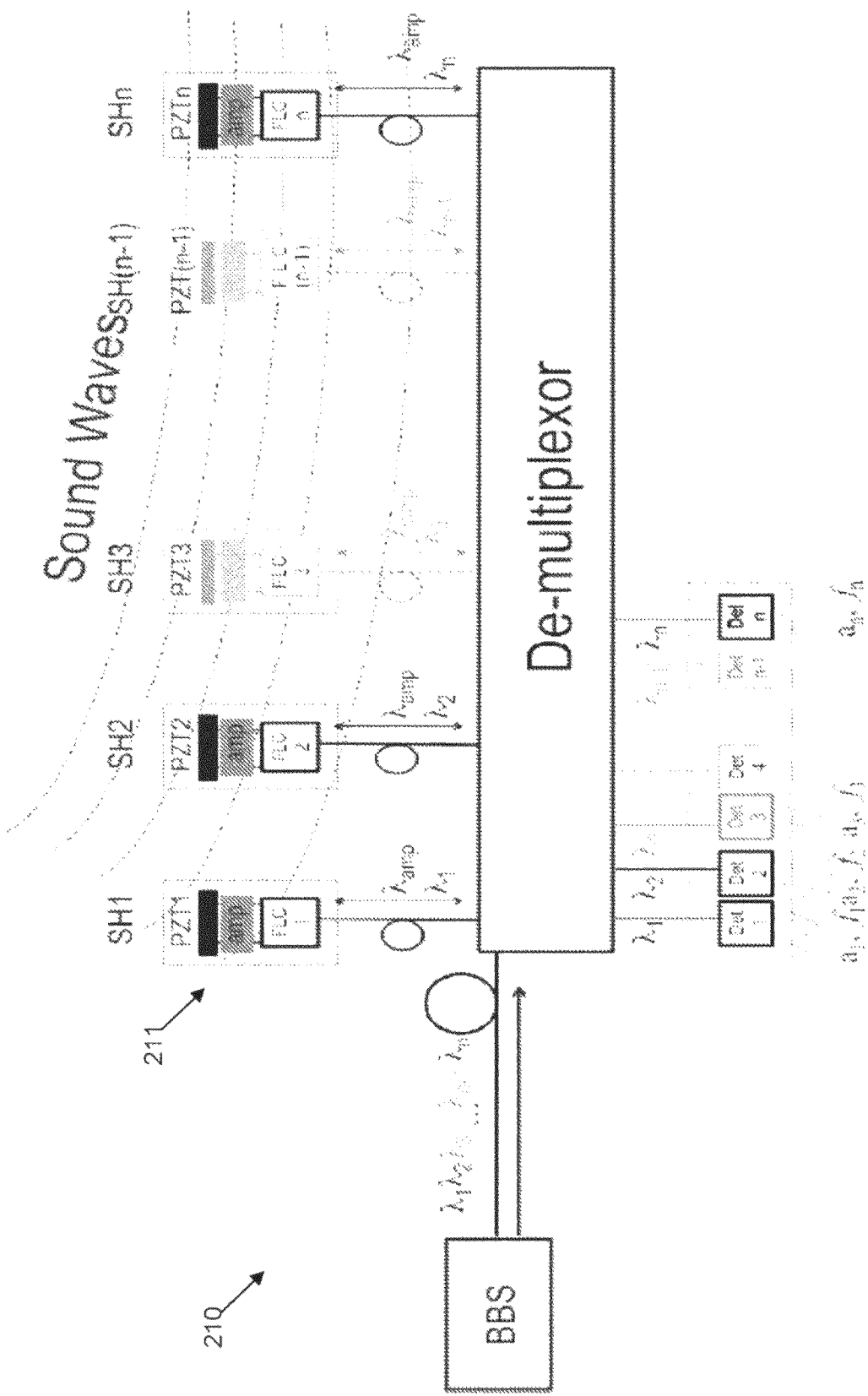
FIG. 20 illustrates an alternative hydrophone arrangement for sensing an environment.
Figure 21:
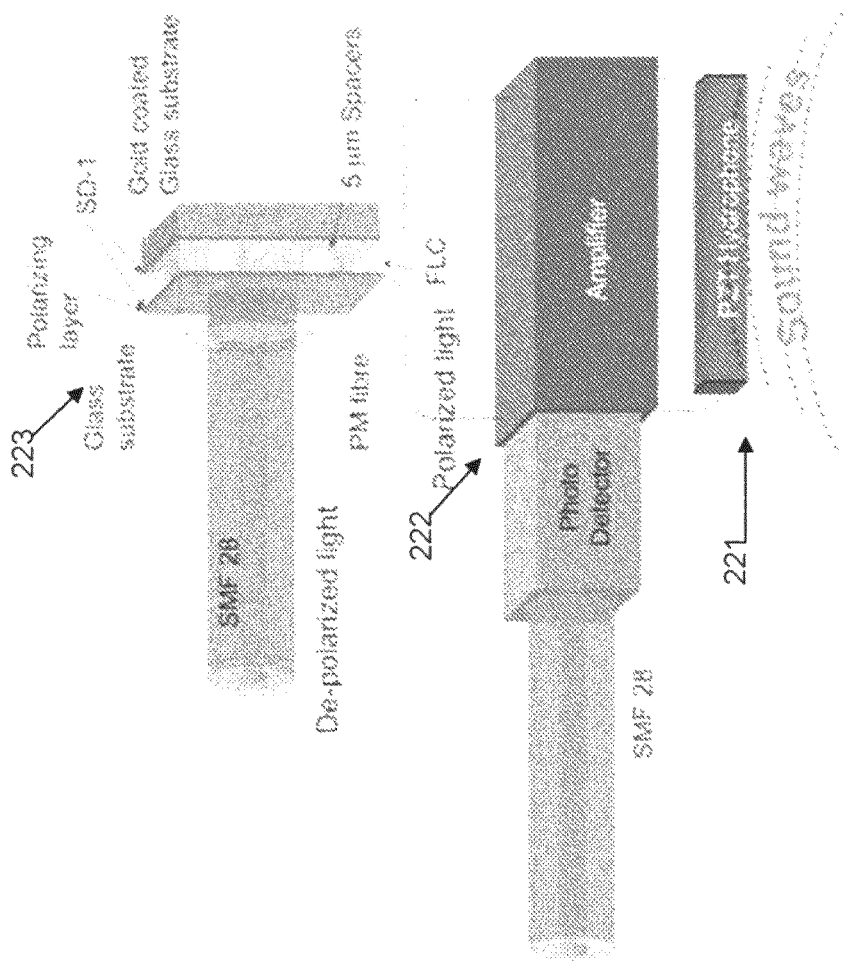
FIG. 21 illustrates the sensing actuator.

The extension of the sensing arrangement to the utilization of hydrophones is shown 210 in FIG. 20. This arrangement is similar to that depicted in FIG. 1, however, the antenna devices have been replaced by hydrophone elements e.g. 211. The hydrophone elements can be as illustrated schematically in FIG. 21 and can include a piezoelectric sensor device 221, amplifier 222 and LC Cell 223.

The electric field required to switch the LC cell is around a few volts per μm. This is normally much higher than would be created by the PZT actuator. The sensitivity of modern ceramic actuators is −164 dBreV/μPa. The response of a ceramic hydrophone to Sea State Zero (SSO) and various underwater noises is between 0.1 μV and 0.6V. Therefore a field amplification is normally required by amplifier 222.

Figure 22:
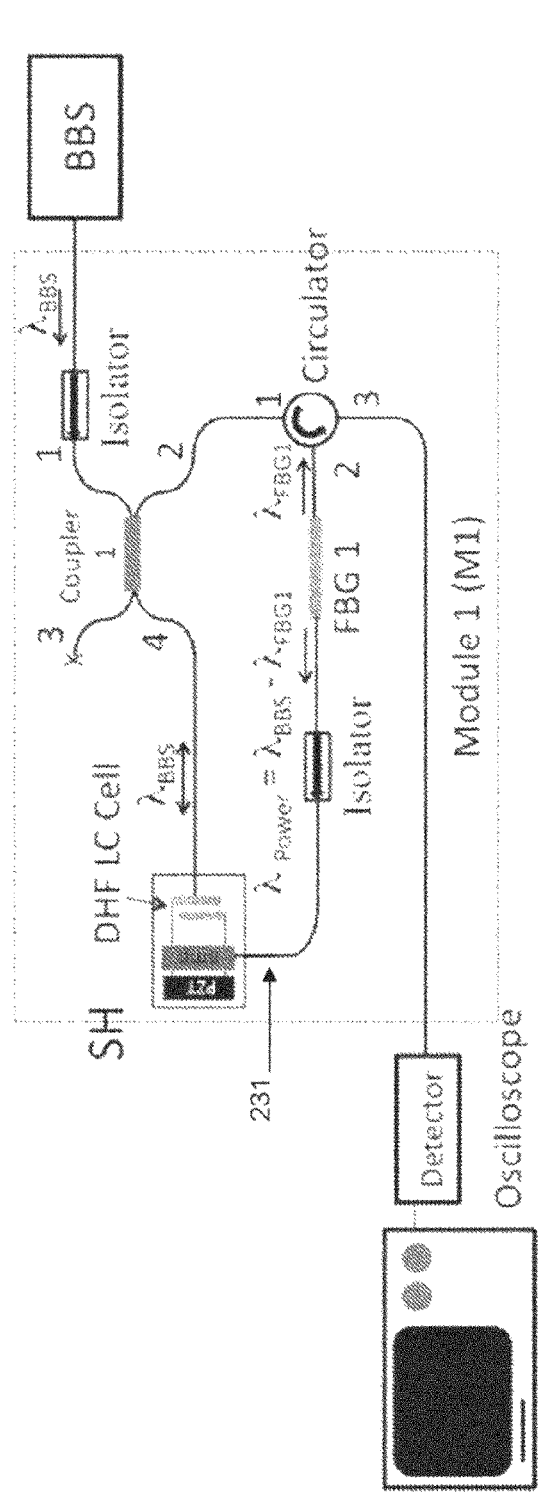
FIG. 22 illustrates an optically powered sensor arrangement.
Figure 23:
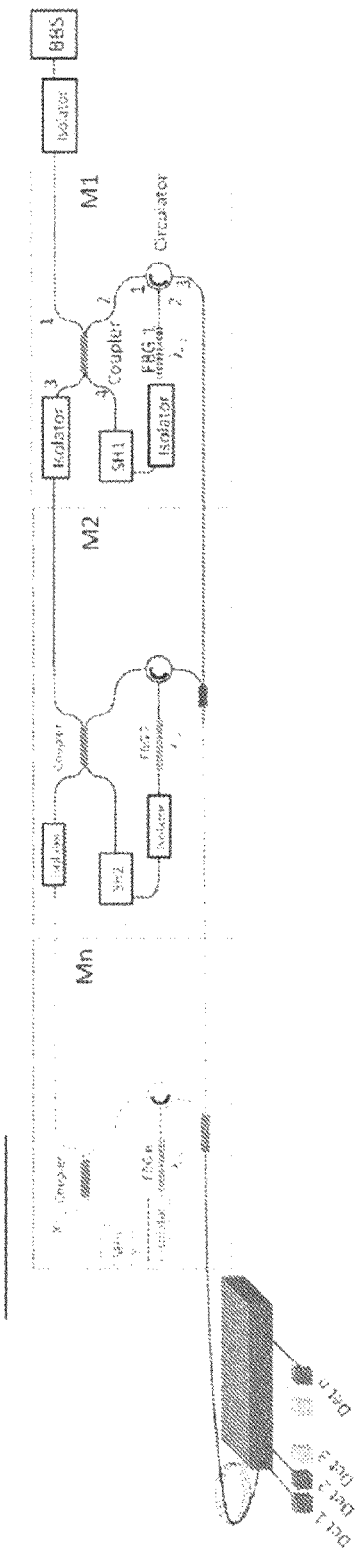
FIG. 23 illustrates a multiplexed hydrophone arrangement.

In an alternative embodiment, the field amplification can be provided by an optically powered amplifier. The optical power signal can be transmitted through a fiber Bragg grating with a wavelength not satisfying the Bragg condition can be used to power the amplifier. Such an arrangement is shown in FIG. 22 wherein the power to the amplifier is provided by a separate optical fiber 231. FIG. 23 illustrates the corresponding multi stage sensor arrangement.

Gas Detection Arrangement

Other applications are possible. For example, the electrodes can be interconnected to a gas detector for detecting changes in particular gas concentrations. A gas detector is a device, which detects the presence of various gases within an area, usually as part of a safety system. This type of equipment is used to detect a gas leak and interface with a control system so a process can be automatically shut down. A gas detector can also sound an alarm to operators in the area where the leak is occurring, giving them the opportunity to leave the area. This type of device is important because there are many gases that can be harmful to organic life, such as humans or animals.

Gas detectors can be used to detect combustible, flammable and toxic gases, and oxygen depletion. This type of device is used widely in industry and can be found in a variety of locations such as on oil rigs, to monitor manufacture processes and emerging technologies such as photovoltaic. They may also be used in firefighting. Generally speaking gas detectors comprise some device connecting the output voltage with the presence of particular gas and its concentration. Gas detectors are categorized by the type of gas they detect: combustible or toxic. Within this broad categorization, they are further defined by the technology they use: catalytic and infrared sensors detect combustible gases and electrochemical and metal oxide semiconductor technologies The sensing technology of the preferred embodiment can be extended to allow monitoring of presence and concentration of gases in multiple points using a passive fibre optic network. The gas detector can be incorporated into the aforementioned optical sensor and can be output as an electrical signal which interconnects across a liquid crystal sensing device.

FIG. 26 illustrates a first schematic gas detector embodiment where the gas detector is passive and directly connected to the LC transducer. LC transducer is broadband and a Fibre Bragg grating (FBG) is used to multiplex the measurement.

FIG. 27 illustrates a second schematic of a gas sensor which is powered optically. The LC transducer operates in a broadband mode and a FBG is used to multiplex the measurement.

Figure 28:
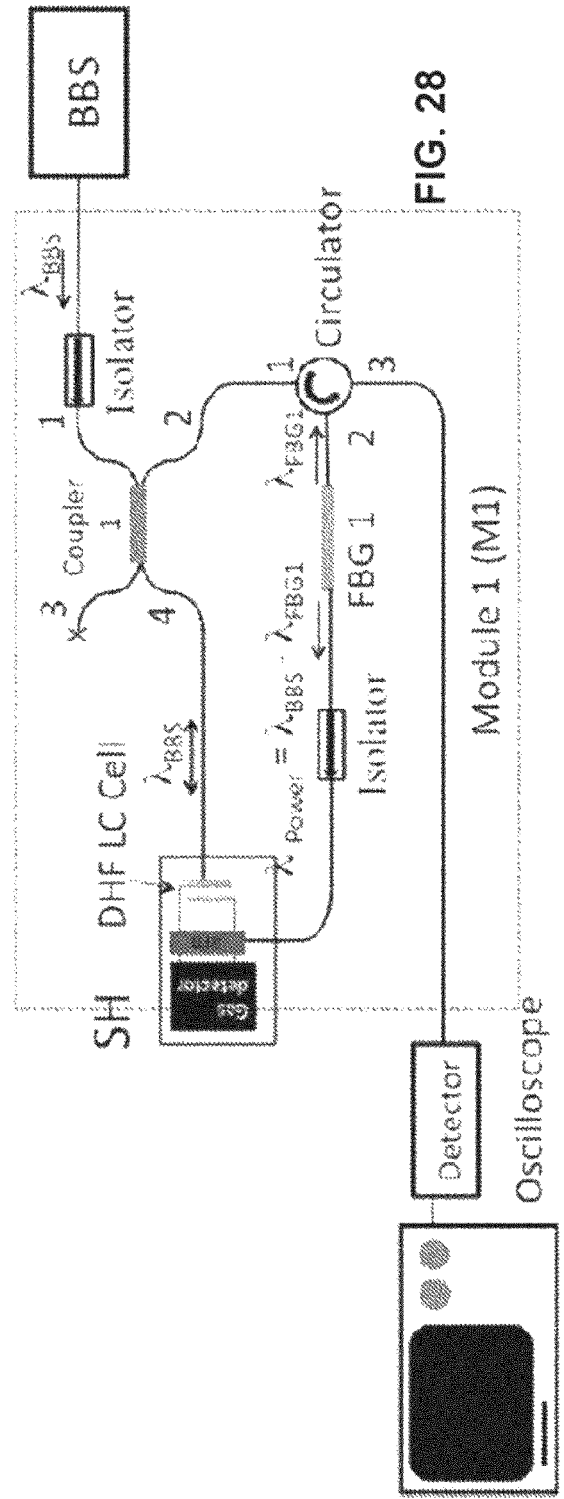
FIG. 28 illustrates schematically a further gas detector arrangement where the gas detector is passive.

FIG. 28 illustrates schematically a further gas detector arrangement where the gas detector is passive. The response off the gas sensor is amplified and the amplifier is powered optically. The LC transducer is broadband and the FBG is used to multiplex the measurement.

Figure 29:
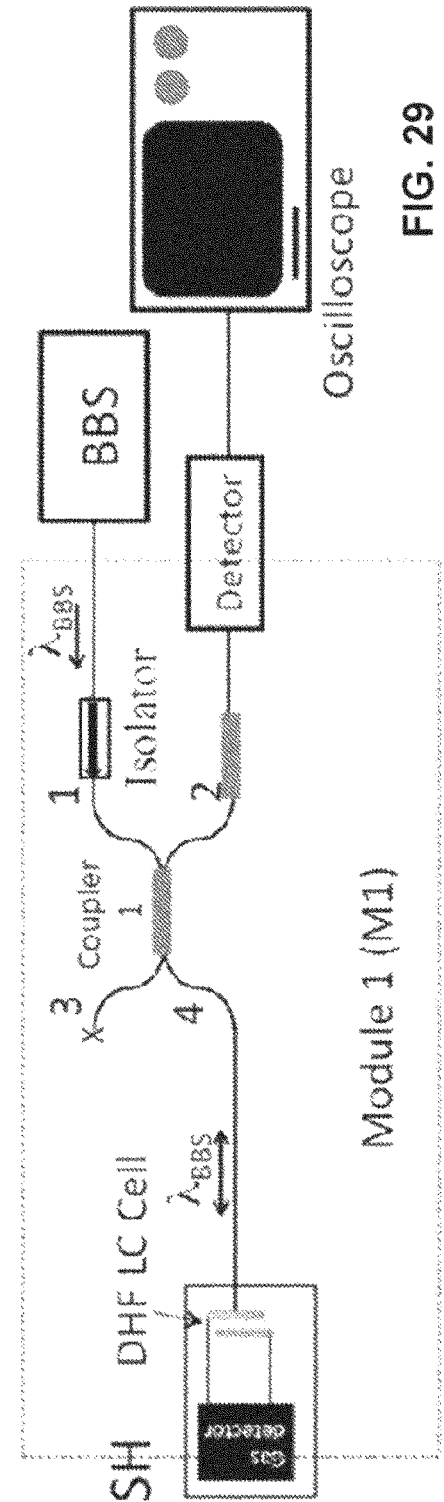
FIG. 29 illustrates schematically a further gas detector which is passive and directly connected to the LC transducer. The LC transducer is narrow-band (Narrow-band reflector).

FIG. 29 illustrates schematically a further gas detector which is passive and directly connected to the LC transducer. The LC transducer is narrow-band (Narrow-band reflector).

Figure 30:
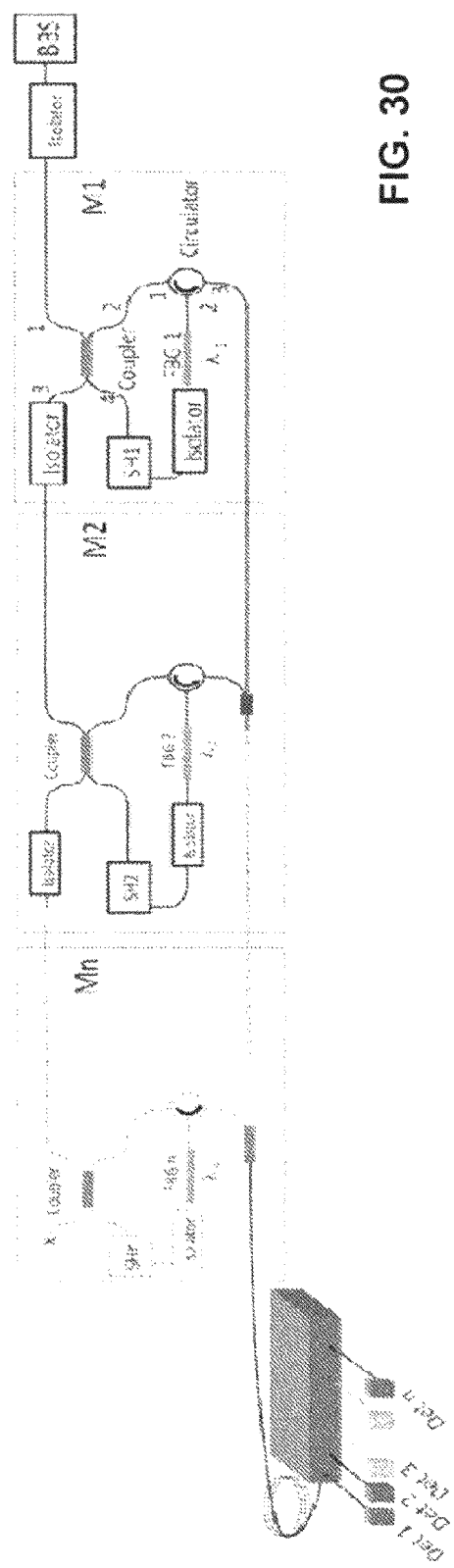
FIG. 30 illustrates a corresponding gas monitoring system with multiple gas sensors. The gas sensors or amplifiers are powered optically. The LC transducer used in the system is broadband and FBG is used to multiplex the measurement.

FIG. 30 illustrates a corresponding gas monitoring system with multiple gas sensors. The gas sensors or amplifiers are powered optically. The LC transducer used in the system is broadband and FBG is used to multiplex the measurement.

Figure 31:
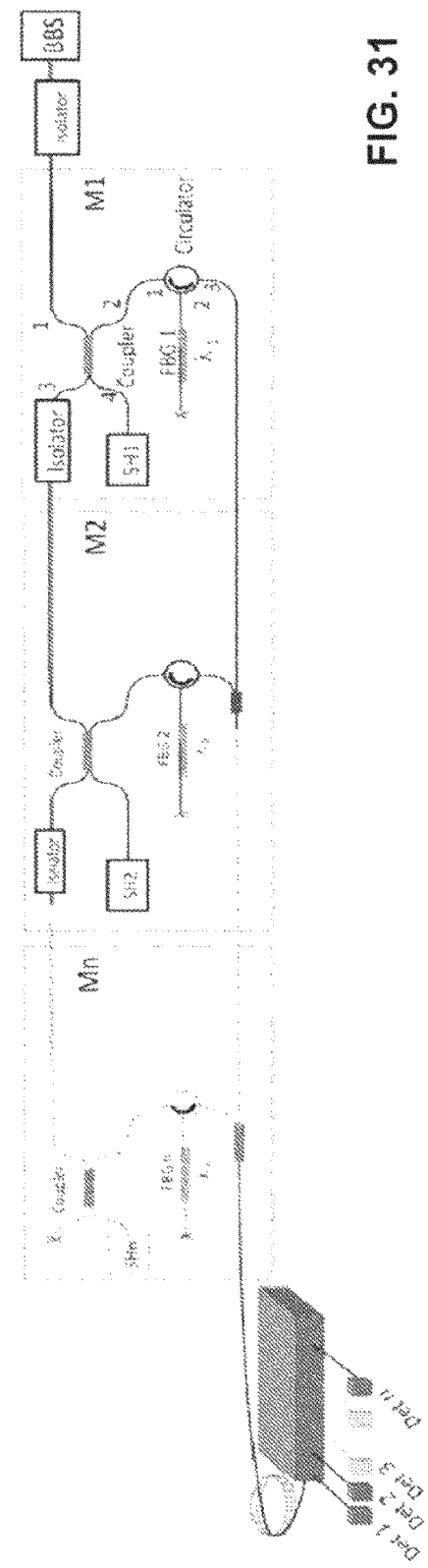
FIG. 31 illustrates schematically an alternative gas monitoring system. The gas detector is passive and directly connected to the LC transducer. The LC transducer used in the system is broadband and FBG is used to multiplex the measurement.

FIG. 31 illustrates schematically an alternative gas monitoring system. The gas detector is passive and directly connected to the LC transducer. The LC transducer used in the system is broadband and FBG is used to multiplex the measurement.

Figure 32:
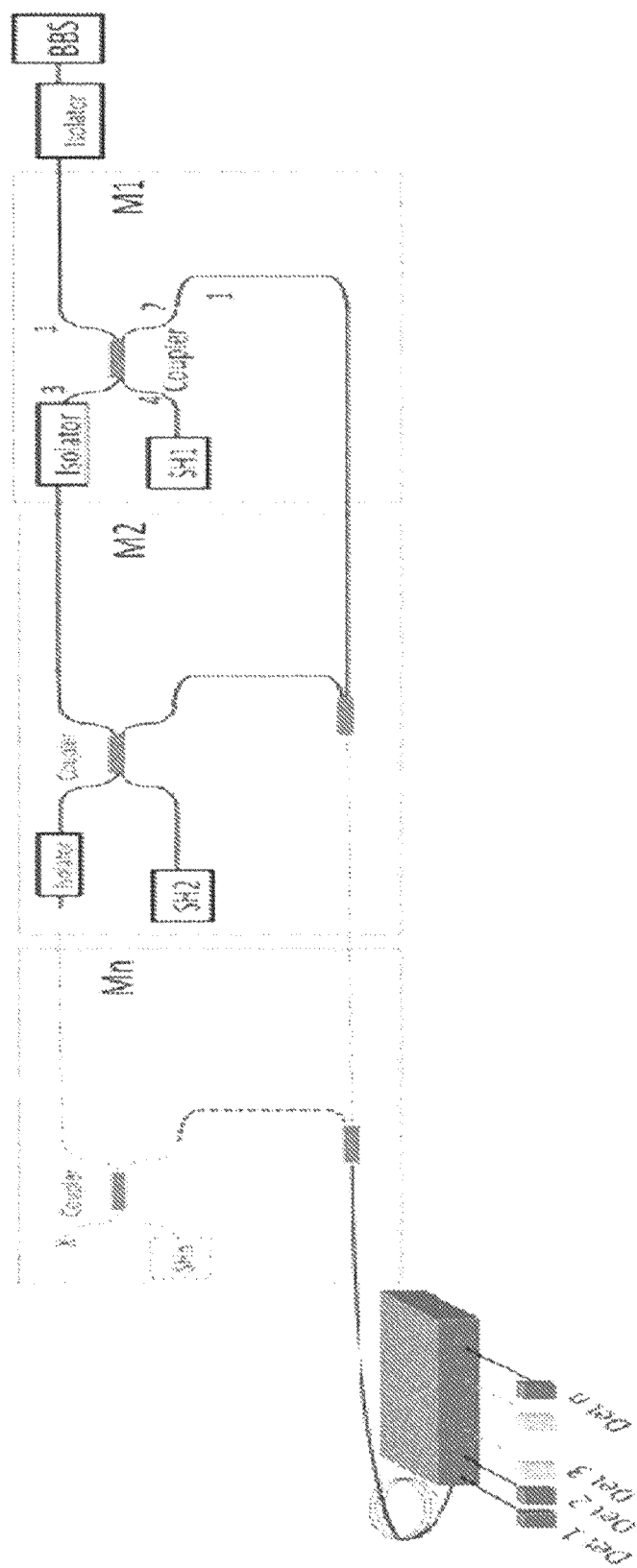
FIG. 32 illustrates schematically a further alternative gas monitoring system. Gas detector is passive and directly connected to the LC transducer. LC transducer used in the system is narrowband.

FIG. 32 illustrates schematically a further alternative gas monitoring system. Gas detector is passive and directly connected to the LC transducer. LC transducer used in the system is narrowband.

Interpretation

The following description and figures make use of reference numerals to assist the addressee understand the structure and function of the embodiments. Like reference numerals are used in different embodiments to designate features having the same or similar function and/or structure.

The drawings need to be viewed as a whole and together with the associated text in this specification. In particular, some of the drawings selectively omit including all features in all instances to provide greater clarity about the specific features being described. While this is done to assist the reader, it should not be taken that those features are not disclosed or are not required for the operation of the relevant embodiment.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of exemplary embodiments of the invention, various features of the invention are sometimes grouped together in a single embodiment, Fig., or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of measuring fluctuations in external electric fields, the method comprising the steps of:
   placing a passive liquid crystal device, which utilizes a liquid crystal material and in which said liquid crystal material exhibits a linear electro-optic response to variations of an external electric field, in communication with the external electric field, said liquid crystal device having its liquid crystal birefringence and the direction of optical axes sensitive to the external electric field;
   receiving an unpolarised optical probe beam, converting the unpolarised optical probe beam to a linearly polarised optical probe beam, utilising the linearly polarised optical probe beam to interrogate the liquid crystal of the liquid crystal device to produce a response beam; and
   analyzing the polarization state of the response beam to provide an indicator of fluctuations in the external electric field;
   wherein the linear electro-optic response of the liquid crystal material is achieved by selection of a predetermined angle between the linearly polarised optical probe beam and an axis of the liquid crystal material, and the linear electro-optic response occurs in a region around 0 external electric field having a magnitude of the external electric field between 0 and 400 kV/m.

2. A method as claimed in claim 1 wherein said liquid crystal device utilizes a Deformed Helix Ferroelectric Liquid Crystal (DHF-LC) liquid crystal material.

3. A method as claimed in claim 1 wherein said liquid crystal device is interconnected to an antenna device via electrodes for magnification of the external electric field experienced by the liquid crystal device.

4. A method as claimed in claim 1 wherein said liquid crystal device is interconnected to a piezo electric sensor device via electrodes for sensing vibrations and/or pressure in an environment, wherein an output signal from said piezo electric sensor is amplified by an amplifier.

5. A method as claimed in claim 1 wherein said unpolarised optical probe beam is fed via a single mode fiber to said liquid crystal device.

6. A passive sensor configured to convert an electrical signal into an optical signal comprising:
   an optical input probe, for inputting an unpolarised optical probe beam;
   a polariser for converting the unpolarised optical probe beam to a linearly polarised optical probe beam;
   a liquid crystal device in communication with an external electric field having its liquid crystal birefringence and the direction of optical axes sensitive to the external electric field, wherein the liquid crystal device utilizes a liquid crystal material and in which said liquid crystal material exhibits a linear electro-optic response to variations of the external electric field, said liquid crystal device being connected to said polariser for transmitting the linearly polarised optical probe beam through the liquid crystal material to produce an optical output beam having an altered polarization state;
   an optical output probe for sensing said output beam; and
   an analyzer for sensing the altered polarization state of the output beam and to thereby determine a correlation with a state of the external electric field;
   wherein the linear electro-optic response of the liquid crystal material is achieved by selection of a predetermined angle between the linearly polarised optical probe beam and an axis of the liquid crystal material, and the linear electro-optic response occurs in a region around 0 external electric field having a magnitude of the external electric field between 0 and 400 kV/m.

7. A passive sensor configured to convert an electrical signal into an optical signal as claimed in claim 6 wherein said liquid crystal device is operated in a reflection mode with the optical input probe also forming the optical output probe.

8. A passive sensor configured to convert an electrical signal into an optical signal as claimed in claim 6 further comprising:
   an antenna device connected to said liquid crystal device for magnification of the external electric field experienced by said liquid crystal material.

9. A passive sensor configured to convert an electrical signal into an optical signal as claimed in claim 6 further comprising:
   a piezo electric sensor interconnected to said liquid crystal device for sensing vibrations and/or pressure in an external environment of the sensor.

10. A passive sensor configured to convert an electrical signal into an optical signal as claimed in claim 6 including a pair of electrodes for converting a voltage difference into an electric field.

11. A passive sensor configured to convert an electrical signal into an optical signal as claimed in claim 6 wherein the optical input probe is attached to the liquid crystal device through a hole formed on one surface of the liquid crystal device, and wherein the optical input probe includes a single mode lead in fiber.

12. A passive sensor configured to convert an electrical signal into an optical signal as claimed in claim 6 wherein the liquid crystal device comprises a Deformed Helix Ferroelectric Liquid Crystal (DHF-LC).

13. A passive sensor configured to convert an electrical signal into an optical signal as claimed in claim 11 wherein the polariser includes a polarising layer, and the optical input probe is attached to the liquid crystal device through the polarising layer and the polarising layer is directly deposited on the one surface of the liquid crystal device in the form of a nano grid or a glass polariser.

14. A passive sensor configured to convert an electrical signal into an optical signal as claimed in claim 12 wherein the DHF-LC is utilised in a linear response range with respect to an applied electric field.

15. A passive sensor configured to convert an electrical signal into an optical signal as claimed in claim 14 wherein the DHF-LC includes a helix axis, and said linear response range is achieved by selection of a predetermined angle between the linearly polarised optical probe beam and the helix axis of the DHF-LC.

16. A passive sensor converting an electrical signal into an optical signal as claimed in claim 14 wherein said optical input probe includes:
   a single mode lead in fiber.

17. A passive sensor configured to convert an electrical signal into an optical signal as claimed in claim 16 wherein the polariser is interconnected to the single mode lead in fiber.

18. A passive optical sensing system including:
   a broadband optical input source;

a series of sensors, configured to convert electrical signals into optical signals, being interconnected to the broadband input source, each sensor configured to:
  convert an electrical signal into an optical signal;
  convert, using a polariser, an unpolarised optical probe beam from the optical input source to a linearly polarised optical probe beam; and
  transmit the linearly polarised optical probe beam through a liquid crystal material having its birefringence and direction of its optical axes sensitive to an external electric field, thereby producing a sensor output beam having an altered polarization state;
  wherein said liquid crystal material exhibits a linear electro-optic response to variations of the external electric field, the linear electro-optic response of the liquid crystal material is achieved by selection of a predetermined angle between the linearly polarised optical probe beam and an axis of the liquid crystal material, and the linear electro-optic response occurs in a region around 0 external electric field having a magnitude of the external electric field between 0 and 400 kV/m;
a series of analyzers for sensing the altered polarisation states of the sensor output beams;
a de-multiplexer for receiving the sensor output beams, filtering a predetermined wavelength range of said sensor output beams to produce a series of optical output channels, and separating each optical output channel coming from the series of sensors; and
a series of photo-detectors for measuring the optical output channels and determining a fluctuation of the external electric field.

19. An optical sensing system as claimed in claim 18, wherein each sensor includes a liquid crystal device, which utilizes the liquid crystal material, and wherein said liquid crystal device is operated in reflection.

\* \* \* \* \*